(12) United States Patent
Alexander et al.

(10) Patent No.: US 8,306,106 B2
(45) Date of Patent: Nov. 6, 2012

(54) MULTI-EDGE PULSE WIDTH MODULATOR WITH NON-STATIONARY RESIDUE ASSIGNMENT

(75) Inventors: Mark Andrew Alexander, Austin, TX (US); Douglas Edward Heineman, Lakeway, TX (US)

(73) Assignee: Equiphon, Inc., Austin, TX (US)

( * ) Notice: Subject to any disclaimer, the term of this patent is extended or adjusted under 35 U.S.C. 154(b) by 351 days.

(21) Appl. No.: 12/790,048

(22) Filed: May 28, 2010

(65) Prior Publication Data
US 2011/0261875 A1  Oct. 27, 2011

Related U.S. Application Data

(60) Provisional application No. 61/328,486, filed on Apr. 27, 2010.

(51) Int. Cl.
*H03K 7/08* (2006.01)
(52) U.S. Cl. .................. 375/238; 370/205; 332/109
(58) Field of Classification Search .............. 375/238; 370/205; 332/109
See application file for complete search history.

(56) References Cited

U.S. PATENT DOCUMENTS

| | | | |
|---|---|---|---|
| 5,198,785 | A | 3/1993 | Jordan |
| 5,548,286 | A | 8/1996 | Craven |
| 6,373,334 | B1 | 4/2002 | Melanson |
| 6,614,297 | B2 | 9/2003 | Score et al. |
| 6,847,257 | B2 | 1/2005 | Edwards et al. |
| 6,965,335 | B1 | 11/2005 | Trotter et al. |
| 6,992,610 | B2 | 1/2006 | Komarura |
| 7,205,917 | B2 | 4/2007 | Magrath |
| 7,209,002 | B2 | 4/2007 | Ohkuri et al. |
| 7,221,297 | B2 | 5/2007 | Ohkuri et al. |
| 7,355,473 | B2 | 4/2008 | Wu |
| 7,391,346 | B1 | 6/2008 | Determan et al. |
| 2004/0239417 | A1 | 12/2004 | Kowkutla et al. |
| 2005/0253649 | A1 | 11/2005 | Morishima |

OTHER PUBLICATIONS

Ronan, Farrell, "An Efficient Parallel Structure for SigmaDelta Modulators for use in High Speed Switching Power Amplifiers," 18th European Conference on Circuit Theory and Design, 2007, pp. 711-714.
Pate, M. et al., "A PCM to PWM Conversion Stage Resolution Enhancement Architecture," 48th Midwest Symposium on Circuits and Systems, 2005, pp. 1653-1656.
Trehan, C. et al., "A High Performance Class-D Amplifier with Cascaded Sigma-Delta Modulators," 47th IEEE International Midwest Symposium on Circuits and Systems, 2004, pp. 1_345-1_348.
Antunes, Victor M.E., et al., "Experimental Evaluation of a Digital Multi-Level Audio Power Amplifier," 2004 35th Annual IEEE Power Electronics Specialists Conference, 2004, pp. 1175-1179.
International Search Report and Written Opinion in Application No. PCT/US2011/033730 dated Aug. 3, 2011, 11 pages.

*Primary Examiner* — Kevin Kim
(74) *Attorney, Agent, or Firm* — Meyertons Hood Kivlin Kowert & Goetzel, P.C.; Jeffrey C. Hood

(57) ABSTRACT

An improved method for generating pulse width modulated signals, e.g., for use in audio amplifiers, power amplifiers, etc. An input digital value is received and divided by a number N, producing a quotient and a residue. A plurality N of edge modulation values may then be generated based on the quotient and the residue. Each of the N edge modulation values specifies an edge of the pulse width modulated signal to be generated. Generation of the N edge modulation values may comprise applying the residue to one or more of the N edge modulation values when the residue is greater than zero. The residue may be applied to different ones of the plurality N of edge modulation values during different iterations of the method in a non-stationary fashion. The pulse width modulated signal may then be generated based on the N edge modulation values.

39 Claims, 15 Drawing Sheets

MULTI-EDGE PULSE WIDTH MODULATOR WITH NON-STATIONARY RESIDUE ASSIGNMENT

PRIORITY CLAIM

The present application claims benefit of priority to provisional application No. 61/328,486 titled "Class D Amplifier" filed on Apr. 27, 2010, whose inventors are Mark Andrew Alexander, Douglas Edward Heineman, and Michael Scot Pate, and which is hereby incorporated by reference in its entirety as though fully and completely set forth herein.

FIELD OF THE INVENTION

The present invention relates generally to pulse width modulators, and more particularly to non-stationary assignment of residue values during pulse width modulation.

DESCRIPTION OF THE RELATED ART

A Class D amplifier, also referred to as a switching amplifier, is an electronic amplifier where the power devices are operated as binary switches that are either fully on or fully off. Class D amplifiers are generally more efficient than linear AB-class amplifiers, which are always operated with both current flowing through and voltage standing across the power devices.

In a Class D amplifier, the input signal is converted to a sequence of rectangular (or near rectangular) pulses whose width is a function of the amplitude of the signal being amplified, via a pulse width modulator (PWM) circuit. The rate at which PWM pulses are issued is termed the Pulse Repetition Frequency (PRF), and is typically an integer multiple of the highest sampling frequency of interest that the input signal can assume. Common input signal sampling rates, which are currently employed in class-D amplifiers, are within the range of 8 kHz to 192 kHz with a tolerance of up to +/−12.5%. The action of the pulse width modulator is to ensure that the integrated or averaged value of the area of the pulse train is generally proportional to the instantaneous value of the amplitude of the modulating input signal. The rate of change of the area of these rectangular pulses is typically proportional to the frequency of the input modulating signal. Also, the range of input frequencies to which the Class-D amplifier will respond is typically limited to an upper bound (i.e., an "in-band" region). This in-band region generally encompasses the range of input modulating frequencies of interest, but is usually constrained to be much less than the pulse repetition frequency (PRF) through some means of electronic low-pass filtering prior to pulse width modulation (PWM).

Various methods may be used to convert the input signal, typically provided in a pulse code modulation format (i.e. "PCM") in the case of a digital class D amplifier implementation, to a train of pulses. For example, the PCM signals may be converted to a train of pulses of varying width, using techniques such as pulse-width modulation (PWM), or constant pulse width and varying density such as pulse density modulation (PDM), or more advanced forms of modulation, such as delta-sigma modulation (AIM). The output pulse train is then provided to a switching controller (also referred to as an output stage) which contains high power switches, typically MOSFETs (Metal Oxide Semiconductor Field Effect Transistors). The high power switches generate a scaled (amplified) high-power replica of the received pulse train.

The output from the output stage (the high power switches) contains, in addition to the amplified signal, unwanted in-band spectral components and unwanted out-of-band spectral components. The unwanted in-band spectral components may comprise harmonic distortion and intermodulation distortion of the input signal, as well as in-band quantization noise. The unwanted out-of-band spectral components may comprise the pulse repetition frequency and its harmonics, sidebands of the modulating signal relative to the pulse repetition frequency and its harmonics, as well as out-of-band quantization noise. Thus, the output from these high power switches is provided to a low-pass filter, which removes the unwanted out-of-band spectral components but leaves the in-band spectral components largely intact. In other words, the output from these high power switches is a high-frequency square wave, and low pass filtering is performed to smooth out the pulses and reconstruct a scaled analog replica of the original signal shape for provision to the load. The scaling factor is generally a function of the power supply voltage fed to the high power MOSFET switches.

Class-D amplifiers typically make use of sampled-data pulse width modulators to convert a digital PCM input signal to a train of constant amplitude pulses. Sampled-data pulse width modulators are commonly known as Uniform Pulse Width Modulators or "UPWM". UPWMs generally introduce a certain amount of in-band distortion and noise into the amplified output signal due to inherent nonlinearities in the PCM to UPWM conversion process. For example, the conversion of a PCM input signal to a corresponding pulse train using a UPWM may result in distortion if the Fourier transform of the integrated area of the pulse train inaccurately corresponds to the Fourier transform of a scaled version original PCM input signal. Therefore, improved modulation techniques are desired for Class-D amplifiers to mitigate the nonlinear behavior of the uniform pulse width modulator from a spectral perspective, thus minimizing its tendency to generate in-band distortion and noise.

The switching controller may also introduce some distortion into the amplified output signal. As noted above, the switching controller generally comprises a "dead time" control circuit and MOSFET gate driver circuits for driving the MOSFETs used in amplifying the received pulse train. Two significant design challenges for MOSFET gate driver circuits in class-D amplifiers relate to "dead time" and "linear mode operation". More specifically, it is important to keep the overall duration of dead time and time spent in linear mode operation as short as possible.

The term "dead time" refers to the period during a switching transition when both output MOSFETs are driven into Cut-Off Mode and both are "off". Dead times should preferably be as short as possible to maintain an accurate low-distortion output signal. However, dead times that are too short cause the MOSFET that is switching on to start conducting before the MOSFET that is switching off has stopped conducting. In this case, the MOSFETs effectively short-circuit the output power supply through themselves, causing a temporary high-current condition known as "shoot-through".

The term "linear mode operation" refers to the "saturation" state between Cut-Off Mode and Triode or Resistive Mode where the MOSFET is neither fully on nor fully off and conducts current with a significant voltage drop across the device, creating significant heat dissipation. This heat can potentially result in excessive thermal stresses to an integrated circuit (IC) implementation of a class D amplifier and the target application system in general. The MOSFET drivers should preferably drive the MOSFETs between switching states as fast as possible to minimize the amount of time a MOSFET is in linear mode.

Driver failures that allow shoot-through and/or too much time spent in linear mode operation result in excessive losses and sometimes catastrophic failure of the MOSFETs. Therefore, improved MOSFET driver techniques are desired for Class D amplifiers.

SUMMARY OF THE INVENTION

Various embodiments are presented of an improved method for generating pulse width modulated signals. Embodiments of the invention may be used in audio amplifiers, power conversion, power amplifiers used in, e.g., driving transducer arrays, such as the voice coil motors in vibration tables, etc., as well as other applications where pulse width modulation of signals is employed. Thus, embodiments of the invention may be used in any of various applications where pulse width modulation of signals is employed. In addition, various embodiments are presented of a Class D audio amplifier, and in particular, improved modulation techniques for a Class BD audio amplifier.

Some embodiments of the invention relate to generation of a pulse width modulated signal corresponding to an input digital value. The input digital value may be received. For example, the input digital value may comprise audio data. The input digital value may be offset by a value "FRAME", and subsequently divided by a number N, thereby producing a quotient and a residue.

A plurality N of edge modulation values may then be generated based on the quotient and the residue. Each of the plurality N of edge modulation values specifies an edge of the pulse width modulated signal to be generated. Generation of the plurality N of edge modulation values may comprise applying the residue to one or more of the plurality N of edge modulation values when the residue is greater than zero. The residue may be applied to different ones of the plurality N of edge modulation values during different iterations of the method. The pulse width modulated signal may then be generated based on the plurality N of edge modulation values.

In one embodiment, the residue is applied to different ones of the plurality N of edge modulation values during different iterations in a non-stationary assignment fashion. For example, the residue may be applied to different ones of the plurality N of edge modulation values during different iterations in a data weighted averaging fashion. The data weighted averaging may be first order data weighted averaging, or may be second or higher order data weighted averaging.

In one embodiment, application of the residue to one or more of the plurality N of edge modulation values operates to assign pulse width to one or more of the edges of the pulse width modulated signal. For example, unit pulses may be assigned to one or more edges of the pulse width modulated signal. The number of unit pulses assigned during a specific iteration preferably corresponds to the value of the residue in that iteration. The unit pulses may be assigned to edges of the pulse width modulated signal in a modulo-N sequential fashion based on a pre-defined edge ordering. In one embodiment, the method is configured to dynamically change the pre-defined edge ordering during different iterations of the method.

In applying the residue (i.e., applying the unit pulses) to one or more of the plurality N of edge modulation values, for each iteration, the method may comprise: 1) calculating a pointer value that indicates the starting edge location for the assignment of unit pulses to one or more of the plurality N of edge locations, where the number of edge locations being assigned corresponds to the residue value in the current iteration; and 2) incrementing the pointer value by the value of the residue. Calculating the pointer value for a current iteration may comprise maintaining a previous pointer value from a prior iteration, and adding a value of the residue in the previous iteration to the previous pointer value. Stated another way, calculating the pointer value for a following iteration may comprise adding a value of the residue in the current iteration to the current pointer value.

In one embodiment, applying the residue to one or more of the plurality N of edge modulation values operates to assign a single unit pulse to each of one or more edges of the pulse width modulated signal in a sequential manner. In this embodiment, the number of unit pulses assigned during a specific iteration corresponds to the value of the residue in that iteration. Further assignment of the single unit pulses to each of the one or more edges may comprise using only a subset N of M assignment possibilities, where M>N, such that the assignment of unit pulses is sequential.

In one embodiment, the pulse width modulated signal that is produced is a differential signal comprising N/2 pulse waveforms, each pulse waveform having a leading edge and a trailing edge. The plurality N of edge modulation values may comprise N edge modulation values, wherein the N edge modulation values modulate the respective leading and trailing edges of the N/2 pulse waveforms. For example, where N=4, there are 4 edge modulation values, and the pulse width modulated signal is a differential signal comprising 2 pulse waveforms, each pulse waveform comprising a single leading edge and a single trailing edge.

In a second embodiment, the pulse width modulated signal comprises 2 pulse waveforms, each pulse waveform having N/4 leading edges and N/4 trailing edges (i.e., a multi-pulse waveform). The plurality N of edge modulation values may modulate the plurality of leading edges and trailing edges of the 2 pulse waveforms. For example, where N=8, there are 8 edge modulation values and the pulse width modulated signal is a differential signal comprising 2 multi-pulse waveforms, with each multi-pulse waveform comprising 2 leading edges and 2 trailing edges.

The above method may be repeated a plurality of times. As described above, the residue may be applied to different ones of the plurality N of edge modulation values during different iterations. This provides a "non-stationary" residue assignment, where the term "non-stationary" refers to the fact that the residue is assigned to different edges of the pulse width modulated signal during different iterations.

In one embodiment, the pulse width modulation method described above may be used in an audio amplifier. In this embodiment, the input audio signal is received and pulse width modulation is performed as described above. This produces a pulse width modulated signal corresponding to the input audio signal. An integrated area of the pulse width modulated signal corresponds to an instantaneous value of the amplitude of the input audio signal. The pulse width modulated signal may then be amplified, and a low pass filtering operation is performed on the amplified pulse width modulated signal to produce the amplified analog audio signal.

BRIEF DESCRIPTION OF THE DRAWINGS

A better understanding of embodiments of the present invention may be obtained when the following Detailed Description is considered in conjunction with the following drawings, in which.

Figure 1:
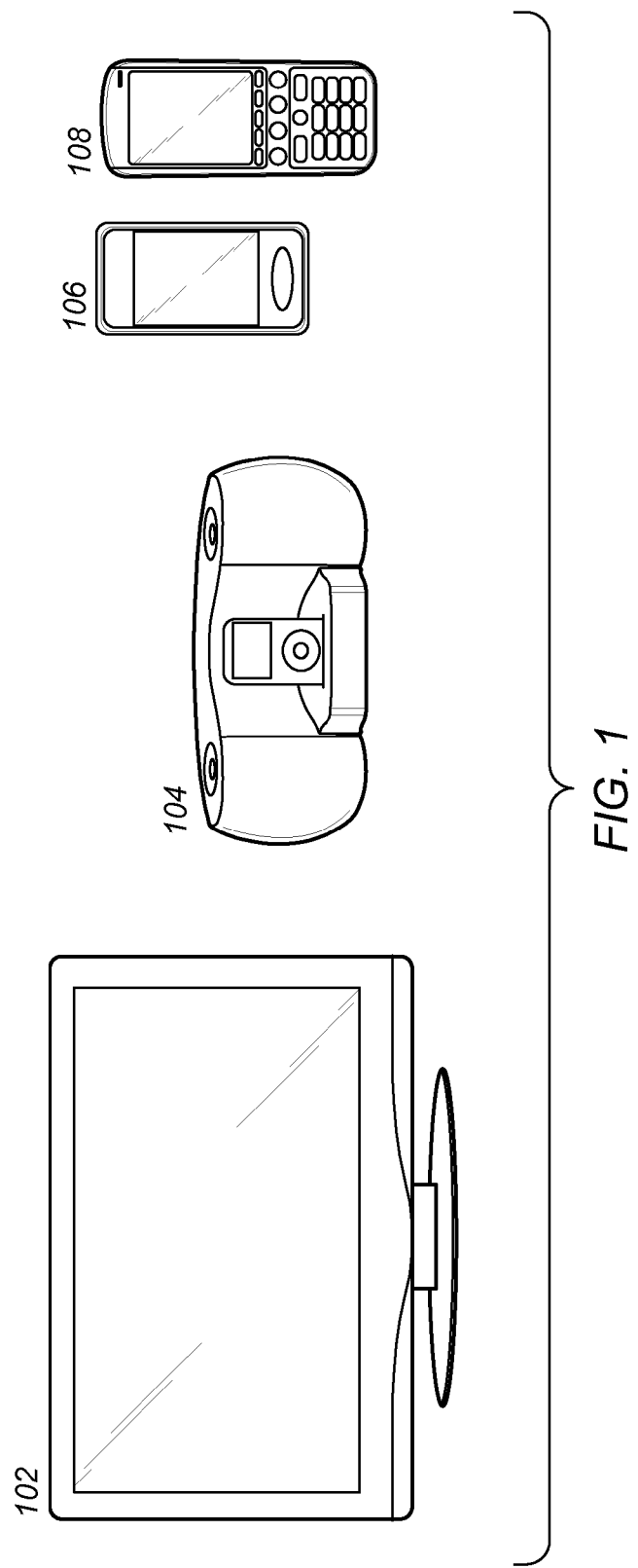
FIG. 1 illustrates various exemplary systems or devices which may use the techniques described herein.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

FIG. 1 illustrates exemplary systems which may utilize the techniques described herein. More specifically, FIG. 1 illustrates exemplary systems which may utilize a Class D amplifier which operates as described herein. As shown, embodiments of the invention may be used in any of various systems which involve amplification of signals. For example, embodiments of the invention may be used in any of various systems which operate to amplify audio signals for provision to a loudspeaker for audible presentation. As shown, the exemplary systems may include a display device 102; an audio system 104, such as a stereo amplified docking station for a portable music player, CD player, etc.; or a telephone 106 and 108, such as a smart phone, e.g., an iPHONE™ or other similar type of smart phone.

Figure 2:
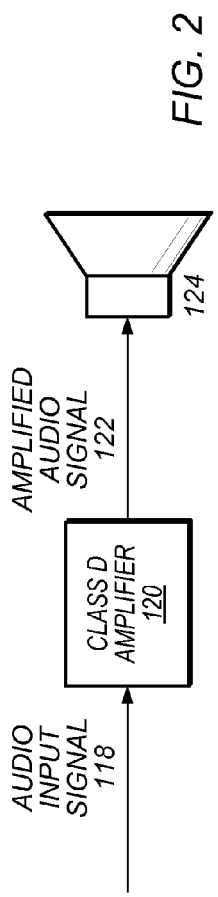
FIG. 2 is a block diagram of a portion of a system including a Class D amplifier.

FIG. 2 illustrates the Class D amplifier 120 which may be present in the systems of FIG. 1. In each of the systems of FIG. 1, at least one Class D amplifier 120 may be present in the audio output section of each device, and more specifically in the amplifier portion of the audio section of each device. As shown in FIG. 2, an audio input signal 118 may be received at an input to the Class D amplifier 120. The Class D amplifier 120 receives the audio input signal 118 and operates to amplify the received audio input signal to produce amplified audio output signals 122. The amplified audio output signals 122 may then be provided to loudspeaker 124 for audible presentation.

Figure 3:
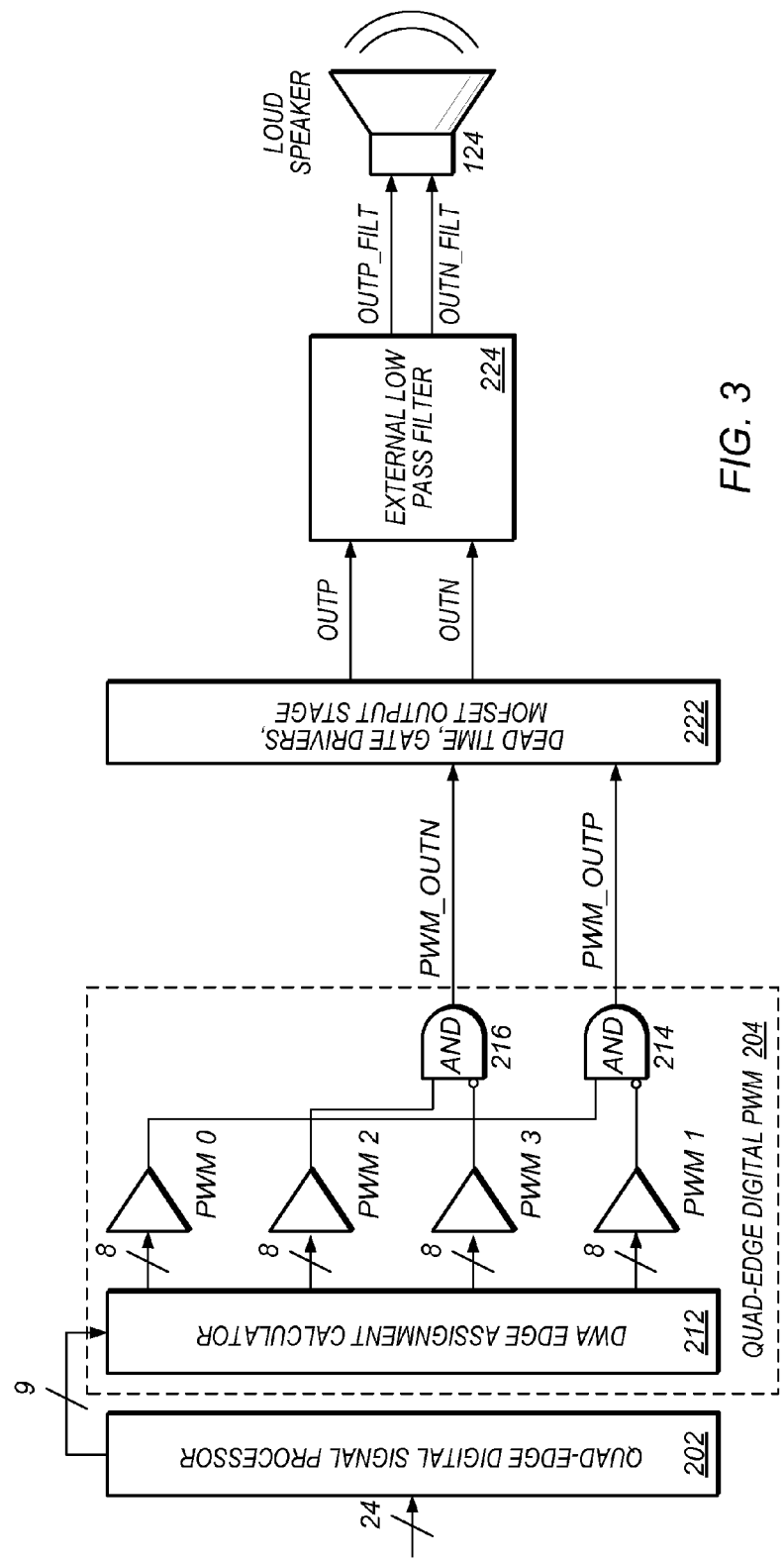
FIG. 3 is an exemplary block diagram of the Class D amplifier of FIG. 2.

FIG. 3 is an exemplary block diagram of the Class D amplifier 120 of FIG. 2, according to one embodiment.

As shown, the Class D amplifier 120 comprises an input that receives digital audio data, in this embodiment a 24 bit pulse code modulated (PCM) input signal. In one embodiment, the 24 bits of PCM digital audio data are received over an industry standard digital serial interface, referred to as the I²S bus, or they may also be received directly from a parallel port type interface. In an embodiment where the digital audio data is received from a Compact Disc (CD), the received digital audio data may comprise 16 bits of data. In this embodiment, the 16 bits are represented within the most significant bits of a data field that is 24 bits wide, along with 8 zeroes that are "padded" (or inserted) into the least significant bits.

The Class D amplifier 120 comprises a digital signal processor, referred to as the Quad-Edge DSP 202. The DSP 202 may be implemented in any of various ways, such as by a programmable digital signal processor, a general purpose processor, an FPGA (Field Programmable Gate Array), or a custom ASIC (Application Specific Integrated Circuit), or a combination of the above. The Quad-Edge DSP 202 may receive the input signal and generate output data that is configured for use in generating a pulse train that corresponds to the input signal. The Quad-Edge DSP 202 receives an input signal, which is shown as 24 bits in this embodiment, and generates a 9 bit output as shown. The output of the Quad-Edge DSP 202 is provided to a Quad-Edge Digital PWM (Pulse Width Modulator) block 204.

The Quad-Edge DSP 202 operates to reduce the number of bits to match the word length requirement of the pulse width modulators (PWMs), referred to as PWM0, PWM1, PWM2, and PWM3. The Quad-Edge Digital PWM block 204 could be designed to receive and use 24 bits. However, in current implementations, this would require that the block 204 have a very high clock rate, i.e., a phase locked loop (PLL) would be required to drive the PWMs at very high frequencies. For example, PWMs designed to operate with up to 24 bits of resolution may require a clock frequency in the hundreds of Gigahertz range, which may be essentially impractical from a circuit implementation perspective. In current embodiments, the Quad-Edge Digital PWM block 204 operates with a frequency in the 200-400 MHz range, which may place an upper limit on the number of bits that the PWMs can receive. In the currently illustrated embodiment, the Quad-Edge Digital PWM block 204 receives 9 bits, and uses a master clock frequency in the range of 200 MHz. In an embodiment where the block 204 receives 10 bits, the clock rate may double to approximately 400 MHz. In the currently preferred embodiment, the Quad-Edge Digital PWM block 204 typically operates at a clock rate less than 500 MHz for reduced power supply consumption.

The Quad-Edge Digital PWM block 204 comprises a DWA Edge Assignment Calculator 212, four PWM blocks labeled PWM0, PWM1, PWM2, and PWM3, and 2 AND gates 214 and 216, and may contain other logic as well. The DWA Edge Assignment Calculator 212 calculates edge locations of the pulse train to be generated. The DWA Edge Assignment Calculator 212 produces four 8 bit outputs. In particular, each of the four 8 bit outputs may represent respective edges of pulses to be generated. The four 8 bit outputs are used by individual pulse width modulators PWM0, PWM1, PWM2 and PWM3, the outputs of which are combined using a suitable logic network into the final differential PWM outputs.

The PWM block 204 comprises a small signal processing block that operates on the 9 bit input data and separates the 9 bit input data into 4 individual streams of 8 bits each. These 8 bit streams may be independent. More specifically, the 8 bit streams may have some correlation to each other, but the actual data may differ on an instantaneous pulse-by-pulse basis, even if the 9 bit input to PWM block 204 is representative of a very low frequency in-band AC waveform or static DC value.

Figure 4A:
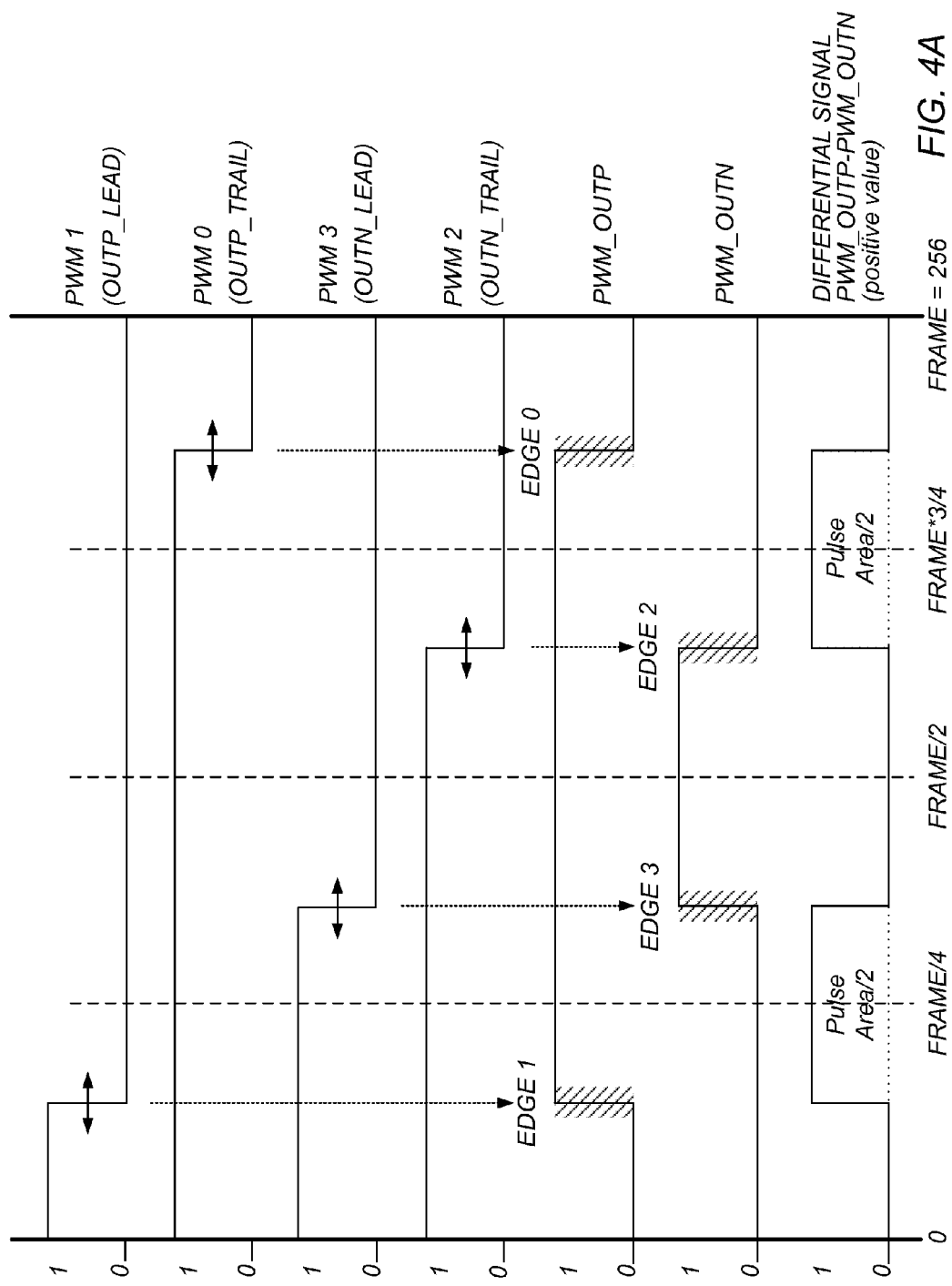
FIGS. 4A and 4B illustrate exemplary pulse waveforms that may be generated in the Class D amplifier of FIG. 3.
Figure 4B:
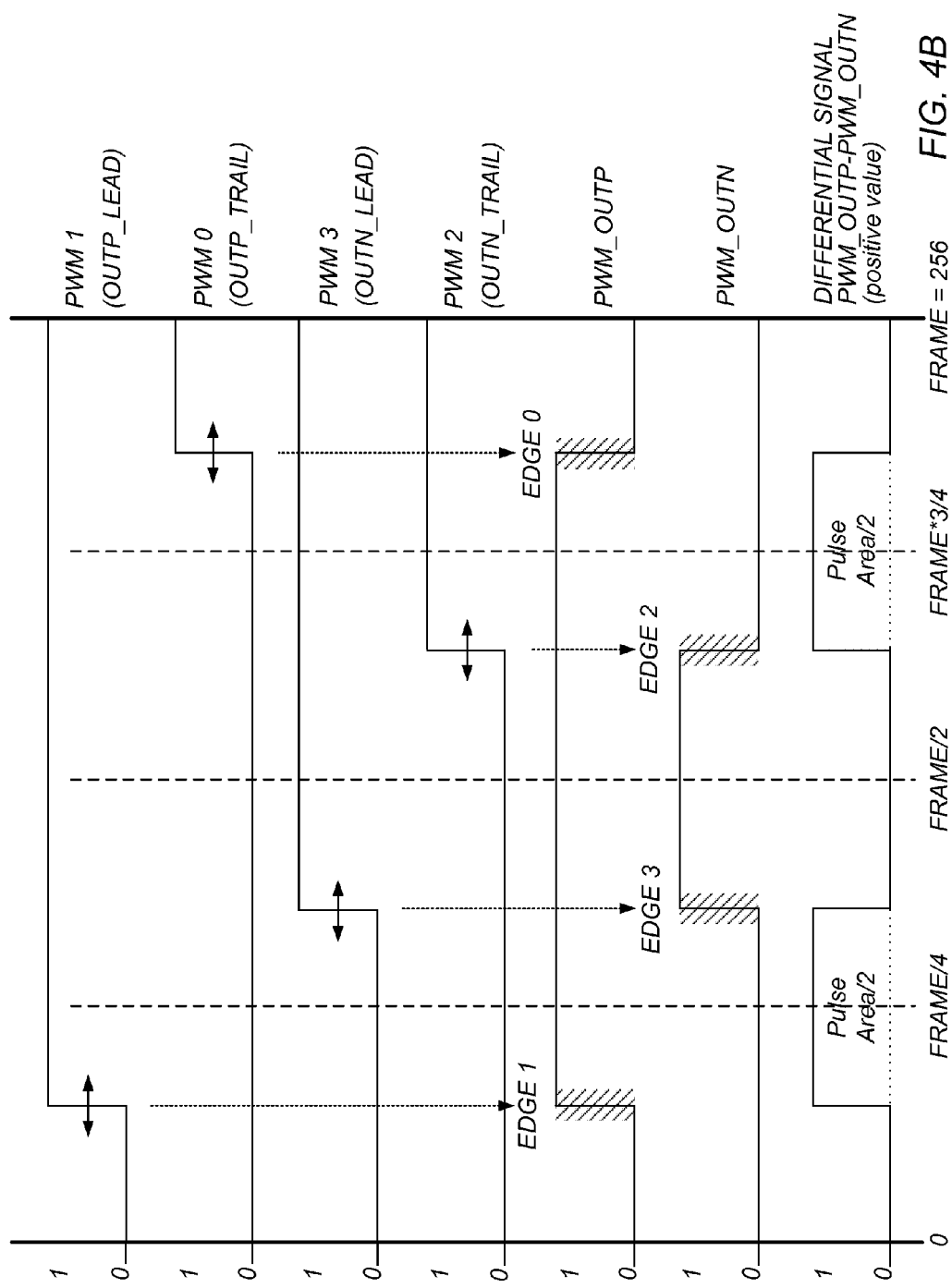

The DWA Edge Assignment Calculator 212 provides four 8 bit output signals to PWM blocks labeled PWM0, PWM1, PWM2, and PWM3. As noted above, the 8 bit output signals represent edges of pulses to be created by the PWM blocks (see FIGS. 4A and 4B). Thus, each 8 bit output signal modulates a specific edge (edges 0, 1, 2, and 3) of the two output signals that are generated, referred to as PWM_OUTP and PWM_OUTN (FIGS. 4A and 4B). The four PWM blocks provide the output pulse trains based on these 8 bit inputs.

As shown, the Quad-Edge Digital PWM block 204 comprises four PWM blocks (PWM0, PWM1, PWM2, and PWM3) and produces only 2 output signals, PWM_OUTP and PWM_OUTN. Thus the Quad-Edge Digital PWM block 204 comprises logic to combine the outputs from each of the four PWM blocks into two output signals. The output of PWM1 may be provided to an inverting input of AND gate 214, and the output of PWM0 may be provided to a non-inverting input of AND gate 214. The output of PWM3 may be provided to an inverting input of AND gate 216, and the output of PWM2 may be provided to a non-inverting input of AND gate 216. The outputs of the AND gates 214 and 216 are referred to as PWM_OUTP and PWM_OUTN. The PWM_OUTP and PWM_OUTN signals, when viewed as a pair, comprise 2 differential pulses per PWM period. The PWM_OUTP and PWM_OUTN signals are provided to a Dead Time, Gate Drivers, and MOSFET Power Output Stage block 222.

FIG. 4A illustrates how the PWM0, PWM1, PWM2, and PWM3 signals are combined to produce the PWM_OUTP and PWM_OUTN signals, when PWM0, PWM1, PWM2, and PWM3 are trailing edge pulse width modulators. A differential output may then be performed using the PWM_OUTP and PWM_OUTN signals. More specifically, the PWM_OUTN signal is subtracted from the PWM_OUTP signal. As shown, the resulting differential signal is composed of two pulses. The sum of these two pulses (i.e., the net area of these two pulses) is a representation of the amplitude being received by the Quad-Edge Digital PWM block 204.

FIG. 4B illustrates how the PWM0, PWM1, PWM2, and PWM3 signals are combined to produce the PWM_OUTP and PWM_OUTN signals, when PWM0, PWM1, PWM2, and PWM3 are leading edge pulse width modulators.

The sequence(s) of pulses generated by the Quad-Edge DSP 202 and the Quad-Edge Digital PWM block 204 (the differential output) may be such that the integrated or averaged value of the area of the pulse train is generally proportional to the instantaneous value of the amplitude of the modulating input signal at the input to Quad-Edge DSP 202. The rate of change of the area of these rectangular pulses may be typically proportional to the frequency of the input modulating signal. Also, the range of input frequencies to which the Class-D amplifier will respond is typically limited to an upper bound (i.e. an "in-band" region). This in-band region generally encompasses the range of input modulating frequencies of interest, but is usually constrained to be much less than the pulse repetition frequency (PRF) through some means of electronic low-pass filtering prior to the PWM circuit. The rate at which PWM pulses are issued is termed the Pulse Repetition Frequency (PRF), and is typically an integer multiple of the highest sampling frequency of interest that the input signal can assume. Common input signal sampling rates, which are currently employed in class-D amplifiers, are within the range of 8 kHz to 192 kHz with a tolerance of up to +/−12.5%.

The Quad-Edge DSP 202 and the Quad-Edge Digital PWM block 204 may perform improved modulation functions on the received signal such that the Fourier transform of the integrated area of the pulse train more accurately corresponds to the Fourier transform of a scaled version of the original PCM input signal. In one embodiment, the Quad-Edge DSP 202 and the Quad-Edge Digital PWM block 204 perform an enhancement of class-BD modulation and operate to generate ternary (−1, 0, +1) differential outputs. This logic may provide independent modulation of 4 edges. In addition, each pulse width modulated (PWM) signal PWM_OUTP and PWM_OUTN may be represented by two unique 8 bit input codes, one code representing the location of the leading edge and one code representing the location of the trailing edge of each waveform. The difference between the two signals, PWM_OUTP and PWM_OUTN, results in an effective differential output waveform with 2 pulses per PWM period. In one embodiment, the repetition rate of each of the differential pulses is equal to 2 times the pulse repetition frequency (PRF) of each of the PWM_OUTP and PWM_OUTN waveforms.

Block 222 may comprise logic for handling dead time, as well as a MOSFET Power Output Stage and gate drivers for controlling the MOSFET Power Output Stage. The MOSFET Power Output Stage portion of block 222 comprises high power switches, preferably MOSFETs (Metal Oxide Semiconductor Field Effect Transistors). The high power switches generate a high-power (amplified) replica of the received pulse train.

The MOSFET Power Output Stage portion provides the amplified pulse train to low pass filter 224. As shown, the Output Stage provides a differential pair of output signals, referred to as OUTP and OUTN, which provide two differential pulses per PWM period. The low pass filter 224 performs a low pass filter operation on the differential pulses and provides the two outputs, referred to as OUTP_FILT and OUTN_FILT, to a load, e.g., to a loudspeaker 124. The output from the output stage (the high power switches) contains, in addition to the amplified signal, unwanted in-band spectral components and unwanted out-of-band spectral components. The unwanted in-band spectral components may comprise harmonic distortion and intermodulation distortion components of the input signal, as well as in-band quantization noise. The unwanted out-of-band spectral components may comprise the pulse repetition frequency and its harmonics, sidebands of the modulating signal relative to the pulse repetition frequency and its harmonics, as well as out-of-band quantization noise. Thus, the output from these high power switches is provided to a low-pass filter, which removes the unwanted out-of-band spectral components but leaves the in-band spectral components largely intact. In other words, the output from these high power switches is a high-frequency square wave, and low pass filtering is performed to smooth out the pulses and reconstruct a scaled analog replica of the original signal shape for provision to the load. The scaling factor is generally a function of the power supply voltage fed to the high power MOSFET switches.

Figure 5:
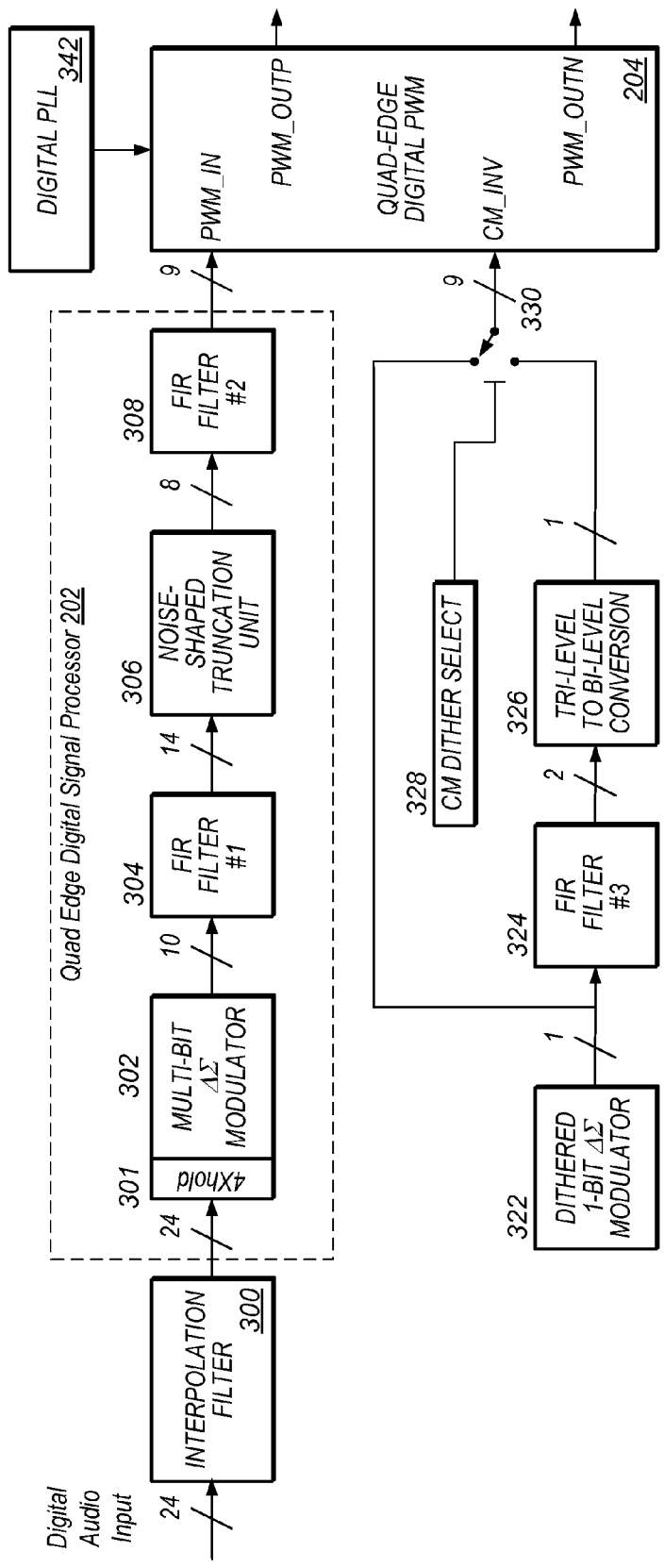
FIG. 5 illustrates an exemplary block diagram of functionality implemented in the Quad-Edge Digital Signal Processor of FIG. 3.

FIG. 5 is an exemplary block diagram of functionality implemented in the Quad-Edge Digital Signal Processor of FIG. 3.

As shown, the digital audio input signal has a wordlength of 24 bits, although it could contain fewer active bits with zero padding as required, and is provided to an Interpolation Filter 300. The audio data is received at its native sampling rate (the sample rate being received by the amplifier 120). In the current embodiment, the sample rate is increased because the Quad Edge DSP 202 and the Quad-Edge Digital PWM block 204 may operate at a higher sampling frequency than the input audio data rate. In one embodiment, no increase in the sampling rate is performed, and the Interpolation Filter 300 is set to a 1× oversampling ratio (or is not included and simply performs a pass-through operation). This may occur where the input sample rate is sufficiently high, e.g., the input sample rate is 192 kHz or 176.4 kHz, which are standard audio sampling rates. For lower sample rates, a 2×, 4×, or 6× interpolation (or oversampling ratio) may be performed. For example, if the input audio signal has a sampling rate of 96 kHz, a 2× interpolation may be performed to double the sampling rate to 192 kHz. If the input audio signal has a sampling rate of 48 kHz, a 4× interpolation may be performed to increase the sampling rate to 192 kHz. If the input audio signal has a sampling rate of 32 kHz (which is used in video recording and television broadcasting), a 6× interpolation may be performed to increase the sampling rate to 192 kHz. The output of the Interpolator 300 is restricted over a certain frequency range, typically from 176.4-192 kHz.

The audio data input to the Interpolation Filter 300 may have one of a plurality of possible sampling rate ranges, e.g., seven different ranges. The Interpolation Filter 300 selectively increases the received sampling rate to one or two possible ranges. Thus, for example, if an equalizer was inserted between the Interpolation Filter 300 and the Quad Edge DSP 202, the equalizer would only be required to support, e.g., two sample rates, instead of seven sample rates. This reduces the number of sets of coefficients that the equalizer (constructed as a plurality of digital filters) is required to store, hence reducing coefficient memory requirements. Reducing the number of equalizer coefficients lowers the data transmission requirements to the Class D amplifier at system start up, hence minimizing bus traffic on an external microprocessor interface such as an $I^2C$ (Inter-IC) bus.

The Interpolation Filter 300 provides a 24 bit output to the Quad Edge DSP 202. One purpose of the Quad Edge DSP 202 is to take a signal that has a word length of 24 bits and reduce it to the number of bits that match the PWM, in this case 9 bits. This bit reduction is performed in a series of stages. Additional filtering is performed on the interpolator output because when one increases the sampling rate of a system, e.g., using a 4× hold circuit, this results in spectral images of the input signal replicated around multiples of the original sampling rate. For example, even though sampling by the 4× hold circuit is performed at 768 kHz, images of the interpolator filter output signal now appear replicated around multiples of 192 kHz. Thus the Quad Edge DSP 202 includes one or more FIR (Finite Impulse Response) filters having zeroes placed at the correct intervals (i.e. at multiples of the interpolator output sampling rate), to remove these unwanted intermediate images and effect a smoothing function on the output samples from the interpolation filter.

The Quad Edge DSP 202 includes a 4× Hold block 301 that samples each interpolator output 4 times. Thus the 4× Hold block 301 produces an output having a rate which is four times higher than its input. The increase in sampling rate is necessary because the sampling rate of the output of the Interpolator 300 is too low to effect adequate noise shaping and pulse width modulation of the interpolated input signal. The 4× sampling rate factor is a trade off between a pulse repetition frequency (PRF) in the pulse width modulator which guarantees acceptable in-band audio signal-to-noise ratio (SNR) performance, and the fact that too high a PWM sampling rate results in a pulse repetition frequency (PRF) which may result in excessive switching losses in the power stage. Excessive switching losses can adversely affect the overall power efficiency of the amplifier subsystem. The amplifier 120 includes power transistors (power MOSFETs) that have to be switched on and off, and this switching of the power MOSFETs places an upper limit on the pulse repetition frequency as previously mentioned. Thus the PWM pulse repetition frequency should not be set at a value which is either too fast or too slow. Current prior art PWM designs generally switch between 350 kHz and approximately 800 kHz. In the current embodiment, the switching is performed at the upper end of this range, approximately between 705.6 kHz and 768 kHz. The upper end of this frequency range is selected because the harmonics of the PWM pulse repetition frequency fall into the AM radio band which extends from 520 kHz to 1710 kHz, and thus it is desirable to have fewer harmonics that fall inside that band. For example, a switching frequency of 350 kHz results in several harmonics which fall inside the AM radio band. However, if that frequency is doubled to 700 kHz, this results in only one harmonic that falls inside the AM radio band.

The 4× Hold block 301 provides its output to a Multi-Bit Delta Sigma Modulator 302 which is designed to have very low in-band shaped quantization noise. The Delta Sigma Modulator 302 performs delta sigma modulation on the received signal and provides a 10 bit output to FIR (Finite Impulse Response) filter #1 304. The Delta Sigma Modulator 302 may be a $4^{th}$ order feedforward delta sigma modulator, and is described further below.

The FIR filter #1 304 performs an FIR filtering function on the received data to suppress unwanted signal images present at the output of Interpolation Filter 300, and outputs a 14 bit result to Noise-Shaped Truncation Unit 306. The FIR filter #1 304 has zeroes spaced at multiples of the interpolator output sampling rate (which is also equal to the Quad Edge Digital PWM sampling rate divided by four). The FIR filter #1 304 is preferably implemented with integer coefficients which simplifies the filter convolution arithmetic due to the lack of a requirement to compute any fractional data bits. The filter 304 may be a seven tap filter with double zeroes at multiples of the output sampling rate of Interpolation Filter 300. The present inventors have discovered that adequate filtering of the unwanted images at the interpolation filter output can be performed on a reduced word length (10 bits) that is the output of the Delta Sigma modulator 302 (which reduces the word length from 24 bits to 10 bits). Thus it has been determined that adequate filtering can be performed on that 10 bit signal as opposed to placing the FIR filter 304 ahead of that Delta Sigma modulator 302. This results in a savings of 14 bits in terms of the data storage required in each of the delay elements necessary in filters 304 and 308. Thus one novel aspect of the amplifier design is that the order of filtering has been rearranged such that filtering is performed on a reduced word length following the initial reduction from 24 bits to a lower value by Delta Sigma Modulator 302.

The FIR filter 304 has low frequency gain. The FIR filter 304 adds bits to its output thus increasing the wordlength, which diminishes the initial bit width reduction gains performed by Delta Sigma Modulator 302. Hence, the Noise-Shaped Truncation Unit 306 operates to remove some of the bits added by filter 304. The Noise-Shaped Truncation Unit 306 may be a $4^{th}$ order error feedback delta sigma modulator, and hence may be a different form of delta sigma modulator than modulator 302. Additionally, the order of error feedback delta sigma modulation employed in Noise-Shaped Truncation Unit 306 may be higher or lower (i.e. $3^{rd}$ or $5^{th}$ order), as dictated by the in-band noise requirements and digital signal processor computational loading constraints. Noise-Shaped Truncation Unit 306 reduces the output word length, i.e., scales the word length down to a suitable number such that when subsequent filtering is performed, the result is the correct number of bits that matches the input wordlength requirement of the PWM. Thus the Noise-Shaped Truncation Unit 306 operates to reduce the word length of the input signal, while preserving the low frequency shaped quantization noise performance of Multi-Bit Delta Sigma Modulator 302. The Noise-Shaped Truncation Unit 306 provides an 8 bit output to FIR filter #2 308.

The Noise-Shaped Truncation Unit 306 also operates to shape its own quantization noise so that it is low in the band of interest (the audio band) and thus does not degrade the shaped quantization noise generated by the Delta Sigma Modulator 302 which is also constrained to be a low value in the band of interest. In other words, the Truncation Unit 306 operates to push its own quantization noise out to higher frequencies such that it maintains the noise performance and in-band SNR of Delta Sigma Modulator 302. The Truncation Unit 306 may also operate to reduce "noise intermodulation" effects in the pulse width modulator. The term "noise intermodulation" refers to the behavior of a nonlinear system such as a uniform pulse width modulator (UPWM), which, when fed with shaped quantization noise from a delta-sigma modulator, causes out-of-band quantization noise components to appear in-band. The spacing of these out-of-band quantization noise components may fall within, or just beyond, the signal band of interest. These out-of-band noise components may intermodulate with each other and produce spurious output noise artifacts that rise above the shaped quantization noise floor present at the input to Quad-Edge Digital PWM block 204. These spurious noise components can potentially degrade the in-band (i.e. audio band) and ultrasonic noise characteristics of the Quad-Edge Digital PWM block 204. For example, the action of feeding the filtered output of the first Delta Sigma modulator 302 which contains both in-band signal components and shaped quantization noise to the second Delta Sigma modulator 306 performs a dithering effect, or digital randomization effect, on the second Delta Sigma modulator 306 that helps to suppress the noise intermodulation behavior in Quad-Edge Digital PWM block 204.

The FIR filter #2 308 performs an FIR filtering function on the output from the second Delta Sigma modulator 306 and outputs a 9 bit output to a Quad-Edge Digital Pulse Width Modulator (DPWM) 204. The second FIR filtering function 308 adds a single zero at half the sampling rate of the second Delta Sigma modulator 306, and helps to suppress its shaped quantization noise in this particular band of frequencies.

Thus the Quad Edge DSP 202 performs at least three primary duties: 1) it provides word length reduction to match the input requirements of Quad-Edge Digital PWM block 204; 2) it provides filtering of unwanted signal images at the output of Interpolation Filter 300 which are replicated at multiples of its output sample rate; and 3) it provides additional preprocessing to assist in the suppression of noise intermodulation effects that occur in the output spectrum of Quad-Edge Digital PWM block 204, which is part of the inherent nature of sampled data pulse width modulation.

Figure 11:
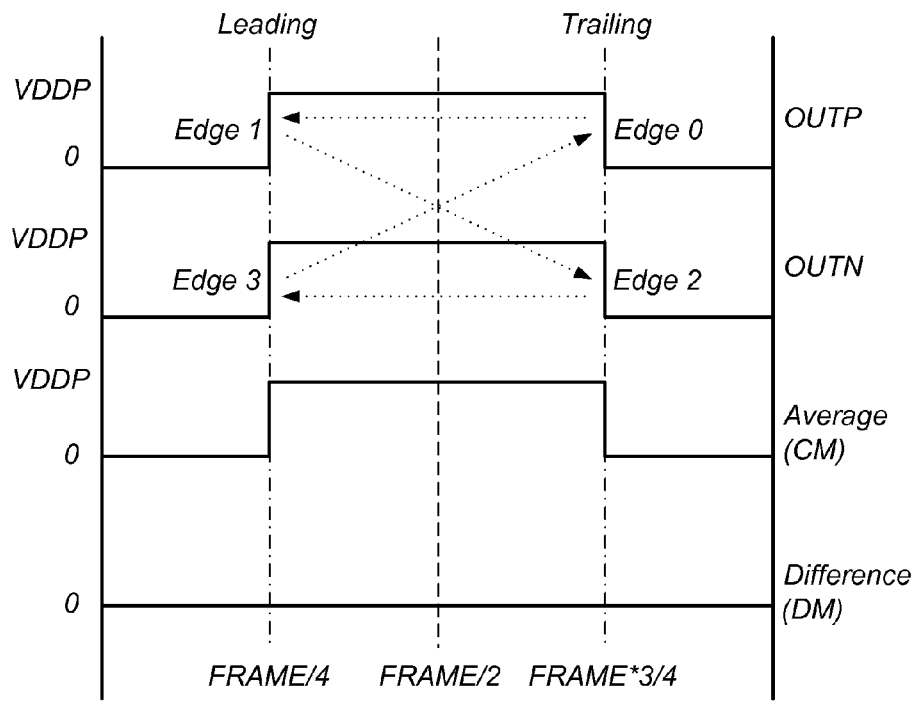
FIG. 11 illustrates edge assignment performed by the Quad-Edge Digital PWM block 204 of FIG. 4, where CM_INV=0.
Figure 12:
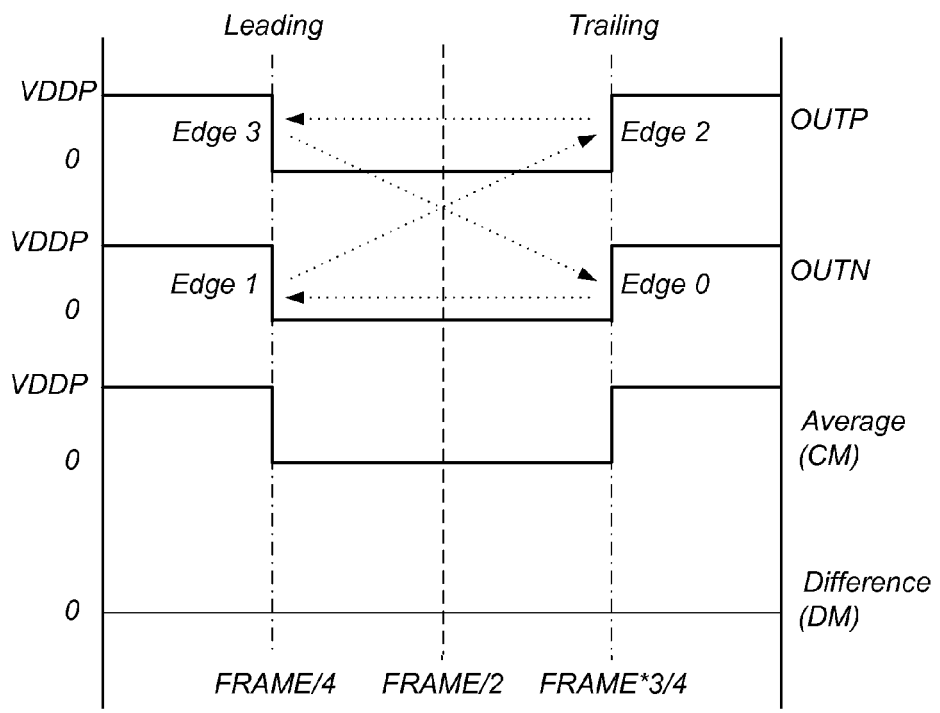
FIG. 12 illustrates edge assignment performed by the Quad-Edge Digital PWM block 204 of FIG. 4, where CM_INV=1.

The Quad-Edge Digital PWM block 204 includes an additional input referred to as CM Invert (CM_INV). This single bit input is used to invert the common mode component of the differential output signal pair (OUTP and OUTN), without altering the polarity of the differential output itself (i.e. OUTP−OUTN). The common mode component is equal to the average value of the two differential output signals (i.e. (OUTP+OUTN)/2). Thus the differential output can either be non-inverting common mode (positive) as shown in FIG. 11, or inverting common mode (negative) as shown in FIG. 12.

As shown, a Dithered 1-Bit Delta Sigma Modulator 322 provides a 1 bit output to FIR Filter #3 324. The Digital Filter #3 324 performs a digital filtering operation on the 1 bit output and provides a 2 bit output to Tri-Level to Bi-Level Conversion block 326. The Tri-Level to Bi-Level Conversion block 326 performs a 2 bit to 1 bit conversion and provides its output to one input of a 2 pole switch 330, whose output is coupled to the CM_INV port of Digital PWM block 204. The output of the Dithered 1-Bit Delta Sigma Modulator 322 is also provided to an input of the 2 pole switch 330. The select or control input of the 2 pole switch 330 receives an output from CM Dither Select block 328, which determines the dither source being fed to the CM_INV port of Digital PWM block 204.

The Common Mode Invert (CM_INV) input is used to select (optionally randomly select using the output of 2 pole switch 330) between the non-inverting common mode (positive) and inverting common mode (negative) states. Regardless of the setting of the common mode input, the differential output is always the same polarity, as commanded by the PWM input code present at the PWM IN port of Quad-Edge Digital PWM block 204. Thus the sign of the differential output (i.e. OUTP−OUTN) is independent of the setting of the common mode invert bit. From a differential perspective, the CM_INV bit affects only the common mode or the average of the two differential signals. In a larger system that incorporates pulse width modulation (PWM), a power stage and a low pass filter, the common mode component radiates from a signal cable connected between the low pass filter and the loudspeaker. Hence it is desirable to affect reduction of that common mode signal. Thus, in one embodiment of the invention, a dithering operation is performed on the common mode component whereby a strong spectral component at the PWM sampling rate or pulse repetition frequency (and at multiples thereof) is randomized or spread around to reduce its effects. Note that the total energy of the common mode component is not actually reduced, but rather the energy is moved or spread over a frequency band. The intent is to reduce the peak spectral spurs that are present in a common mode signal such that the energy in those spurs, which would normally fall into AM radio band, are spread out presumably below the reception threshold of an AM radio receiver.

A Digital PLL (Phase Locked Loop) provides an oscillation signal to an input of the Quad-Edge Digital PWM block 204, which serves as the master timing reference for the time increment stepsize used to define the discrete edge locations being generated in individual pulse width modulators PWM0, PWM1, PWM2 and PWM3. The Quad-Edge Digital PWM block 204 performs an improved modulation function which is further described below. The Quad-Edge Digital PWM block 204 outputs the two differential signals PWM_OUTP and PWM_OUTN.

Figure 6:
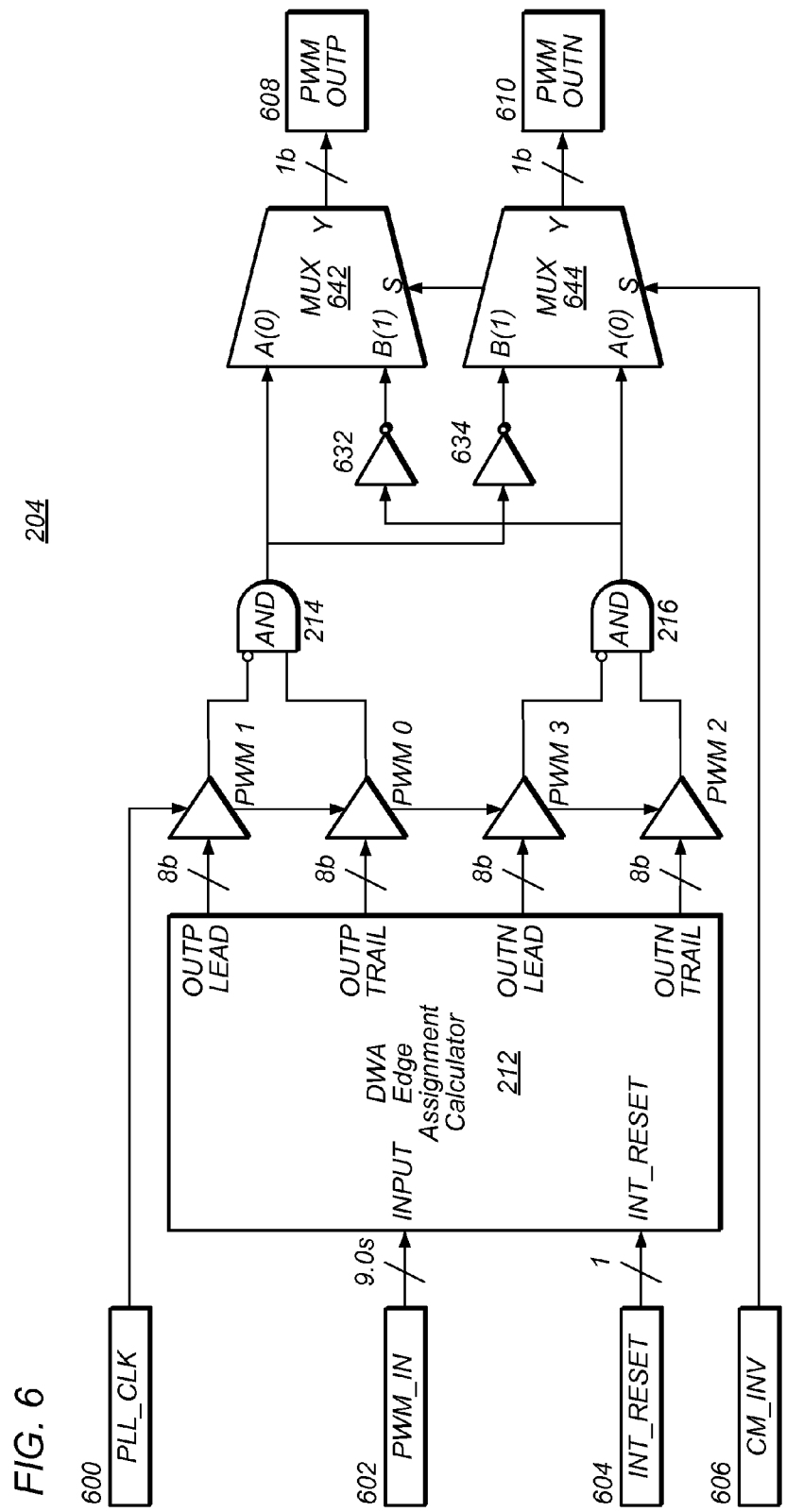
FIG. 6 illustrates an embodiment of the Quad-Edge Digital PWM block 204 of FIG. 4.

FIG. 6 illustrates an embodiment of the Quad-Edge Digital PWM block 204. The Quad-Edge Digital PWM block 204 comprises three main components: 1) the Data Weighted Averaging (DWA) Edge Assignment Calculator 212; 2) A bank of 4 Pulse Width Modulators (PWM0, PWM1, PWM2, and PWM3); and 3) Combining Logic to produce a pair of differential outputs, PWM_OUTP and PWM_OUTN, from the bank of 4 Pulse Width Modulators (PWM0, PWM1, PWM2, and PWM3).

As shown, the PWM IN signal 602 output from the Quad Edge DSP 202 is provided as a 9 bit signed input to the DWA Edge Assignment Calculator 212. An INT_RESET signal 604 is provided to an INT_RESET input of the Calculator 212, which may clear an internal register of the calculator to zero when asserted. The DWA Edge Assignment Calculator 212 generates four 8 bit outputs, where each 8 bit output corresponds to an edge of the PWM signals being generated. The four outputs are referred to as OUTP LEAD (OUTP leading edge), OUTP TRAIL (OUTP trailing edge), OUTN LEAD (OUTN leading edge), and OUTN TRAIL (OUTN trailing edge). Each of these four outputs is provided to an assigned Pulse Width Modulator, labeled PWM1, PWM0, PWM3, and PWM2, respectively.

The Pulse Width Modulators also receive a digital PLL Clock output (PLL_CLK). The PLL_CLK signal that drives the PWMs is equal to the input frame rate or pulse repetition frequency (PRF)×256 for a 9b PWM. For example, if the PWM pulse repetition frequency was 768 kHz, the PLL would operate at 256 times that frequency (196.608 MHz).

The Pulse Width Modulators, when implemented individually as trailing edge modulators (see FIG. 4A), provide their outputs to respective AND gates as described above with respect to FIG. 3. As described above, the output of PWM1 may be provided to an inverting input of AND gate 214, and the output of PWM0 may be provided to a non-inverting input of AND gate 214. The output of PWM3 may be provided to an inverting input of AND gate 216, and the output of PWM2 may be provided to a non-inverting input of AND gate 216. The outputs of the AND gates 214 and 216 are provided to two multiplexers (MUX'es) 642 and 644 in both a direct and inverted cross-coupled fashion. More particularly, the output of AND gate 214 is provided to A(0) input of multiplexer 642. The output of AND gate 216 is provided through an inverter 632 to B(1) input of multiplexer 642. The output of AND gate 216 is provided to A(0) input of multiplexer 644. The output of AND gate 214 is provided through an inverter 634 to B(1) input of multiplexer 644. The multiplexers 642 and 644 each receive the common mode inversion signal (CM_INV) 606 to their select inputs. When the select signal CM_INV 606 is 0, multiplexer 642 outputs the signal from AND gate 214 and multiplexer 644 outputs the signal from AND gate 216. However, when select signal CM_INV 606 is 1, multiplexer 642 outputs the inverted cross-coupled signal from AND gate 216 and multiplexer 644 outputs the inverted cross-coupled signal from AND gate 214. The multiplexers 642 and 644 provide the PWM_OUTP 608 and PWM_OUTN 610 signals, respectively. More specifically, the MUX 642 outputs the one bit PWM_OUTP signal 608, and the MUX 644 outputs the one bit PWM_OUTN signal 610. As noted above, the PWM_OUTP 608 and PWM_OUTN 610 signals comprise 2 differential pulses per PWM period.

The outputs of the AND gates 214 and 216 form a useable signal. However, the MUX'es 642 and 644 and the inverters 632 and 634 are included to provide the option of selectively inverting the common mode component of PWM_OUTP 608 and PWM_OUTN 610. The configuration of inverters 632 and 634 and MUX'es 642 and 644 enable reversing or "flipping" the common mode component while still maintaining the correct sense (or pulse width polarity) of the differential output. The CM_INV signal 606 is provided to the MUX'es 642 and 644 to selectively enable inversion of the common mode commanded by a suitable control circuit as shown.

Figure 7:
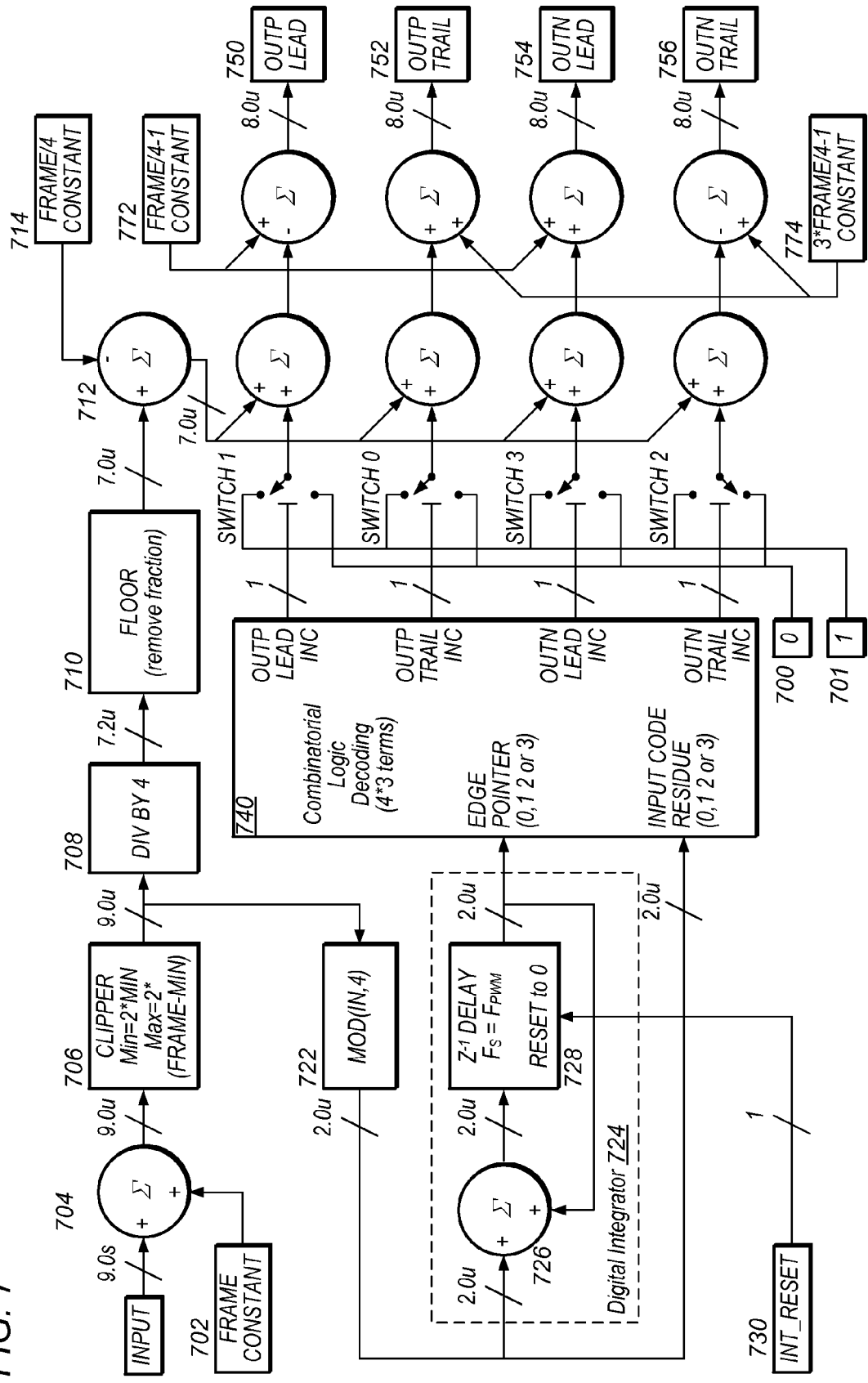
FIG. 7 illustrates an embodiment of the DWA Edge Assignment Calculator of FIG. 6.

FIG. 7 is a more detailed block diagram of the Edge Assignment Calculator 212 of FIG. 6. The Edge Assignment Calculator 212 takes in a signed number (a 9 bit number as shown in this embodiment) that describes the net pulse width and polarity thereof that is to be generated. The sum of all the pulses in the output pulse width (i.e. appearing between the differential signal pair formed by PWM_OUTP and PWM_OUTN) corresponds to the signed numerical value of this input. The 9 bit input is an assigned number that has both a positive and negative range, a range that extends from +255 to −256 centered at zero. The Edge Assignment Calculator 212 receives this 9 bit input signal (which is a signed number) and creates four 8-bit unsigned numbers, each varying from 0 to 255. Each of those 8 unsigned outputs is fed to its own PWM (PWM0-PWM3), and the outputs are combined as shown.

The Edge Assignment Calculator 212 converts the received 9 bit signed number to the four 8 bit unsigned outputs as follows:

First, the Calculator 212 includes a summation block 704 that receives the 9 bit signed input. The summation block 704 also receives a constant value, referred to as "FRAME", from a memory 702. The summation block 704 converts the 9 bit signed input to a 9 bit unsigned number by adding the FRAME constant to the input. The FRAME value is equal to $2^{(N-1)}$, where N is the number of bits in the digital word at the input to Quad-Edge Digital PWM block 204, and is equal to 9 in this embodiment. The constant "FRAME" is also representative of the maximum number of clock ticks in a PWM period, and is thus equal to 256 in this case because the maximum value of the 9 bit signed input signal, in an absolute value sense, is 256. The signed input value is thus converted into an unsigned number by adding a half-scale offset called FRAME. Thus the 9 bit signed number is converted into a 9 bit unsigned number which ranges from 0 through 511.

The 9 bit unsigned number is then provided to a Clipper block 706 in the Calculator 212. The Clipper block 706 essentially provides a "guard-band" on the pulse generation process in Quad-Edge Digital PWM block 204. In other words, the Clipper block 706 provides limiting on the 9 bit unsigned number. This limiting of the data values is performed in order to prevent the pulse width modulator from generating pulses that are either too narrow or too large. This provides protection for the power MOSFETs in Block 222, i.e., ensures that the power MOSFETs are not turned on and off too quickly, since they cannot switch infinitely fast. The Clipper block 706 uses a value called MIN pulse width, which is expressed in clock ticks, i.e., periods of the phase locked loop output that drives the PWM. In the current embodiment, the MIN pulse width is 8. On the high side (positive side), the Clipper 706 clips at 2×(FRAME−MIN). If Frame is 256 and MIN is 8, the clipping level is 248×2, or 496. Thus the Clipper 706 clips at 496 on the high side. On the low side the Clipper 706 clips at 2×MIN, which is 16. Thus, instead of extending from 0 to 511, the signal is clipped to a range of 16 thru 496. These clipping levels provide a minimum guard band pulse of value MIN on each of the two outputs PWM_OUTP and PWM_OUTN, such that the smallest time spacing between adjacent falling or rising edges (or vice versa) on either of the these outputs allows for complete turn-on or turn off of the power MOSFETs in Block 222. Using the value of PLL_CLK as shown at 196.608 MHz, a clock period or time step increment of 5.09 ns is realized. With a predetermined MIN pulse width value of 8 clock periods on each of the two output signals PWM_OUTP and PWM_OUTN, an effective guardband pulse width of approximately 40.7 ns is realized. This is an acceptable minimum pulse size given the improved high frequency switching behavior of modern power MOSFETs.

The output of the Clipper block 708 is provided to a Divider block 708 as well as to Modulo Residue Calculation block 722.

The Modulo Residue Calculation block 722 performs a Modulo-4 residue extraction. The residue of a signal is the remainder when one performs division. Thus when the output of the Clipper block 706 is divided by a value of 4 (i.e. the divisor), this produces a quotient plus a remainder that is equal to 0, 1, 2, or 3. The quotient is the portion of the output of Clipper block 706 which is divisible by four. The Modulo Residue Calculation block 722 calculates this residue value (remainder value), and provides a 2 bit unsigned value (which can be either 0, 1, 2, or 3) as an input to Block 740. This input code residue is used by the block 740 in the pulse width modulation, as described further below. The output of the Modulo Residue Calculation block 722 is also provided as an input to Digital Integrator 724.

The Divider block 708 divides the 9 bit unsigned number from Clipper block 706 by 4. This produces an integer value (i.e. the portion of the input to Divider block 708 which is divisible by four) plus a fractional component that is equal to 0, ¼, 2/4, or ¾. The Divider block 708 provides these outputs to Floor block 710. The Floor block 710 performs a flooring operation which removes the fractional component, thus producing an integer value which, by way of example, is equal to the input to Divider block 708, less the residue value computed in block 722, divided by 4.

The output of the Floor block 710 is therefore a 7 bit unsigned number that extends from 4 through 124. This 7 bit unsigned number is then converted back to a signed number. As shown, the 7 bit unsigned number is provided to a Subtractor block 712, which subtracts a constant (FRAME/4 or 64) from the number and thus shifts it back down to a zero centered value. Thus the Subtractor block 712 shifts the unsigned 7 bit number to a signed number which now has a range from −64 to +63; however, the action of Clipper block 706 ensures this signed number is limited to values which have a symmetrical range of −60 to +60. This signed number is termed the offset. The offset then is sent to an output calculation block where it is added in equal quantity to all four of the PWM code generators.

Three components are used in creating each of the 8 bit words OUTP_LEAD, OUTP_TRAIL, OUTN_LEAD, and OUTN_TRAIL, these being the signed offset output from Subtractor block 712, a constant fixed offset, and the residue. The constant offset is either one quarter of the FRAME minus one (i.e. FRAME/4−1), stored in memory element 772, or three-quarters of the FRAME minus one (3*Frame/4−1), stored in memory element 774. When generating signals for the leading edge PWM, i.e., the signal that modulates OUTP_LEAD and OUTN_LEAD, the constant FRAME/4−1 (the value 63) is added. This provides the range of modulation in the first half of the pulse width period. When modulating the trailing edges of the PWM signals, i.e., the signal that modulates OUTP_TRAIL and OUTN_TRAIL, the constant 3*FRAME/4−1 (the value 191) is added. These constants operate to shift the range of pulse width modulation into either the first half or second half of the PWM cycle, as required, thus producing the correct output waveform. These constants "drop out" in the net differential output calculations, but are used to generate the correct individual waveforms which drive the power MOSFETs in Block 222.

A signed number ranging between −64 and +63 from subtractor block 712 is added to all outputs equally. However, as shown, the action of clipper block 706 limits the actual range from −60 to +60. The Summation Blocks for the OUTP_LEAD and OUTN_TRAIL signals include a minus sign that inverts the sense of the number at one of their two inputs, whereas the Summation Blocks for the OUTN_LEAD and OUTP_TRAIL signal include a plus sign that does NOT invert the sense of the number at one of their two inputs. It should be noted that the outputs of all Summation Blocks are constrained to be positive 8 bit unsigned numbers, since they are sent to digital PWM blocks that process only unsigned data. The reason that minus signs in one of the two inputs are required for Summation Blocks which generate the OUTP_LEAD and OUTN_TRAIL signals is explained as follows: For pulse width modulation in blocks PWM0, PWM1, PWM2 and PWM3, the preferred embodiment uses only trailing edge modulators which receive an unsigned 8 bit data input. With respect to trailing edge pulse width modulation, a positive change in the PWM code causes the trailing edge to move to the right and thus increase the pulse widths. However, a negative change (i.e. a reduction) in the PWM code causes the trailing edge to move to the left and thus decrease the pulse widths. With reference to the OUTP_LEAD and OUTN_TRAIL signals, the minus signs in their Summation Blocks causes the direction of edges produced by PWM1 and PWM2, respectively, to move to the left for positive PWM input codes. With reference to the OUTN_LEAD and OUTP_TRAIL signals, the plus signs in their Summation Blocks causes the direction of edges produced by PWM3 and PWM0 respectively to move to the right for positive PWM input codes. For positive input codes to Quad-Edge Digital PWM block 204, this action results in edges OUTP_LEAD and OUTP_TRAIL that move apart from each other, while edges OUTN_LEAD and OUTN_TRAIL move closer to each other, thus resulting in a net positive differential pulse area. For negative input codes to Quad-Edge Digital PWM block 204, conversely, the same action results in edges OUTP_LEAD and OUTP_TRAIL that move closer to each other, while edges OUTN_LEAD and OUTN_TRAIL move apart from each other, thus resulting in a net negative differential pulse area.

Block 740 performs calculations associated with assigning the residue data in a non-stationary manner during the generation of edge modulation signals OUTP_LEAD, OUTP_TRAIL, OUTN_LEAD, and OUTN_TRAIL. In one embodiment, Block 740 performs data weighted averaging calculations in assigning the residue data. As noted above, the division by 4 produces a residue (remainder) that has a value of 0, 1, 2 or 3. This residue is an extra code that is used in calculating the correct pulse width. In other words, the Divide by 4 block 708 produces the quotient, which is used in generating the pulse width, and the Modulo Residue Calculation block 722 produces the residue which is also used to affect the pulse width. The residue code is assigned as one or more unit pulses, which are then applied to the respective edge increment control signals OUTP_LEAD_INC, OUTP_TRAIL_INC, OUTN_LEAD_INC, OUTN_TRAIL_INC. These "increment" control signals are sent to a bank of four switches (SWITCH 0, SWITCH 1, SWITCH 2 and SWITCH 3), which determine whether a +1 is added to each of the PWM0, PWM1, PWM2 or PWM3 codes being generated, or whether a "0" is added. The number of these increment control signals which are assigned to add a +1 to each of their respective PWM codes is equal to the residue value computed by block 722. Block 740 operates to assign the residue code (0, 1, 2 or 3) as 0, 1, 2, or 3 individual unit pulses, respectively, and assigns the unit pulses to respective edges using an internal selection algorithm. This internal selection algorithm is thus used to direct the generation and sequencing of the "increment" control signals which are sent to the bank of four switches, as described above. If the residue is 1, 1 unit pulse is assigned to one of the four edges. If the residue is 2, 2 unit pulses are assigned to two of the four edges. If the residue is 3, 3 unit pulses are assigned to three of the four edges. Block 740 uses selection theory to determine the set of possible outputs. If the residue is 1 and hence there is one unit pulse, there are four different ways of assigning this one pulse to the four possible edges. If the residue is 2 and hence there are two unit pulses, there are six different ways of assigning these two pulses to the four possible edges. If the residue is 3 and hence there are three unit pulses, there are four different ways of assigning these three pulses to the four possible edges. The total solution set of available means of assigning unit pulses for all cases where the residue is 0, 1, 2 or 3 is thus 15, which includes the zero case where no unit residue pulses are being assigned to any of the four edges. In the preferred embodiment of block 740, only four of the six ways (i.e., the 4 sequential assignment possibilities) of assigning two unit pulses to the four edges are employed, indicating that a specific subset of all possible edge assignment options is still acceptable for correct system operation.

Block 740 comprises data weighted averaging calculators which calculate where the pulses (residue) are assigned. Here, instead of using a fixed pattern assignment, where the unit pulses are always assigned to the same edge, a non-stationary method of residue assignment (or unit pulse assignment) is performed. In the currently preferred embodiment, the non-stationary method of residue assignment is a technique referred to as "data weighted averaging". If, in every PWM cycle, the residue (unit pulses) were always assigned in the same fixed fashion, this would create the correct differential pulse width. However, since uniform pulse width modulation (UPWM) is actually somewhat non-linear, the actual location(s) where the residue data is assigned affects the in-band noise intermodulation behavior of the PWM. Thus, according to one embodiment of the invention, an improved residue data assignment method is used which attempts to improve the in-band noise intermodulation behavior of Quad-Edge Digital PWM block 204. Instead of having a fixed assignment at a given edge (e.g., edge zero), Block 740 calculates a pointer that changes or moves every cycle, wherein this pointer determines the starting location where the residue data (unit pulses) are assigned.

Embodiments of the invention may perform a "non-stationary" residue assignment, where the term "non-stationary" refers to the fact that the residue is assigned to different edges of the pulse width modulated signal during different iterations. In the currently preferred embodiment, the pointer is calculated (and hence the residue is assigned) using first order data weighted averaging, which is one implementation of various means of a non-stationary form of residue data assignment. The pointer indicates to which edge the unit pulses will begin being assigned, and the pointer increments by the current value of the residue every cycle (and will wrap back to 0 after reaching value 3, in a modulo-4 arithmetic fashion). Other means of non-stationary data assignment for the residue (unit pulses) include, but are not limited to: Higher order data weighted averaging (i.e. second or third order DWA) using additional computational elements in the pointer arithmetic logic; Pseudo-random data assignment by way of a pseudo-random number (i.e., pointer) generator which controls, via a separate and independent computational process, how the unit pulses are assigned; Random assignment, and other means of non-stationary data assignment.

As shown in FIG. 7, the Edge Assignment Calculator 212 includes Digital Integrator 724 which generates the edge pointer for residue assignment. The residue value is output from Modulo Residue Calculation block 722 and provided as a 2 bit unsigned input to Digital Integrator 724. As shown, the Digital Integrator 724 comprises a Summation block 726 and 2 bit unit delay register (or storage) block 728 which provides a single PWM cycle delay between its input and output ports. In other words, the unit delay register 728 will transfer the data on its input port to its output port after a single PWM cycle delay, and hold that value for the entire next PWM cycle. A signal from the output of delay block 728 is sent back to the second input of summation block 706, thus completing the feedback loop necessary to form a digital integrator. The Summation Block 726 adds the value of the current pointer which is available at the output port of unit delay register 728 to the current residue value from Modulo Residue Calculation block 722, and provides a 2 bit unsigned output to the input of unit delay 728. This summation of current residue and current pointer values will then appear at the output of unit delay block 728 during the next PWM cycle. Block 728 operates to wrap the pointer value to 0 after reaching value 3 in a Modulo-4 arithmetic fashion. By way of example, if the current pointer value is 3, and the current residue value is also 3, then the Modulo-4 arithmetic value of the sum is the remainder when dividing by 4, which is equal to 2.

Thus if there is a non-zero residue, the method assigns the residue data (unit pulses) to successive edges, as determined by the pointer value. Thus if the residue is 2 and the pointer is set to location zero, the method would assign residue data (unit pulses) to location (edge) zero and location (edge) one. If the pointer was set to location one, the assignment begins at edge one and a unit pulse is assigned to edge one and also edge two. After each assignment or cycle, the data pointer increments by the value of the residue, but wraps back to 0 after reaching value 3 using Modulo-4 arithmetic as described.

The pointer is preferably reset to zero coming out of a system reset to ensure that the system always starts from a well defined state. For example, if the reset value of the pointer is zero and the first residue number is 2, two unit pulses are assigned to the first two edges beginning at edge 0 (one to each edge), and the pointer is incremented by 2, so that in the next cycle the pointer is set to 2. If the next residue value is 1, a unit pulse would be assigned starting at edge 2 (the third edge), and the pointer would be incremented by 1, and thus set to 3 during the following PWM cycle. Thus the pointer incrementing is performed using a Modulo-4 (i.e. wraparound 2 bit) arithmetic calculation as previously described.

Thus block 740 uses a 2 bit pointer that is calculated based on the input residue data. The 2 bit pointer is a running sum of the residue codes from all previous calculations, and as described, uses wraparound 2 bit arithmetic. The pointer (which can assume values of 0, 1, 2, or 3) is used to indicate to block 740 where the 1, 2 or 3 unit pulses are to be assigned, e.g., where a +1 is added to one or more of the four 8 bit PWM codes. Thus, given that the edge pointer can assume 4 distinct values, and that the residue can assume 3 non-zero values where unit pulses must be assigned, a decoding tree of 4×3 or 12 possible decision branches may be used. This is shown diagrammatically in FIG. 10, where the decoding tree results in one of 12 possible outcomes, when the residue from Modulo Residue Calculation block 722 has a non-zero value. Thus, according to embodiments of the invention, if the residue is 0, 1, 2, or 3 the method adds 0, 1, 2, or 3 unit pulses, respectively, and the pointer indicates where (i.e. at which edge) to begin adding those pulses. Thus, even if the data remained the same between 2 cycles, the pointer would necessarily change. The data (the actual number of unit pulses) would remain the same, but the starting edge location where they were being assigned would change. The non-stationary assignment performed in embodiments of the invention thus uses a pointer to control the edge assignment. In the currently preferred embodiment, data weighted averaging is used as the form of non-stationary assignment.

It should be noted that if the residue data is identically zero, indicating that the input code to block 722 is exactly divisible by 4, then the no unit pulses are assigned by block 740 and the pointer value is not incremented. In this case, all of the SWITCH 0-SWITCH 3 elements are set to select "0" from memory 700 and feed that value to their outputs. In other words, neither the residue value nor the pointer value are used in the edge assignment calculations when the input code to Block 722 is exactly divisible by 4, and only the output from Subtractor block 712 is used (i.e. the signed "offset").

It is noted that this residue assignment technique is not limited to any particular type of pulse width modulation, e.g., is not limited to any particular number of edges. For example, assuming an 8 edge PWM, the residue may take on a value from 0-7. Hence, in this embodiment, the method may assign from 0-7 unit pulses to 8 edges. Thus the residue assignment method described above is not limited to a quad-edge (4 edge) PWM, but may be applied to any multi-edge PWM. Thus the above describes an exemplary embodiment of the invention. Thus embodiments of the invention may relate to a non-stationary residue data assignment algorithm for a multi-edge PWM system where unit pulses are assigned to respective edges of the PWM in a non-stationary manner, and the possible number of unit pulses being assigned may be one less than the number of edges.

Figure 8:
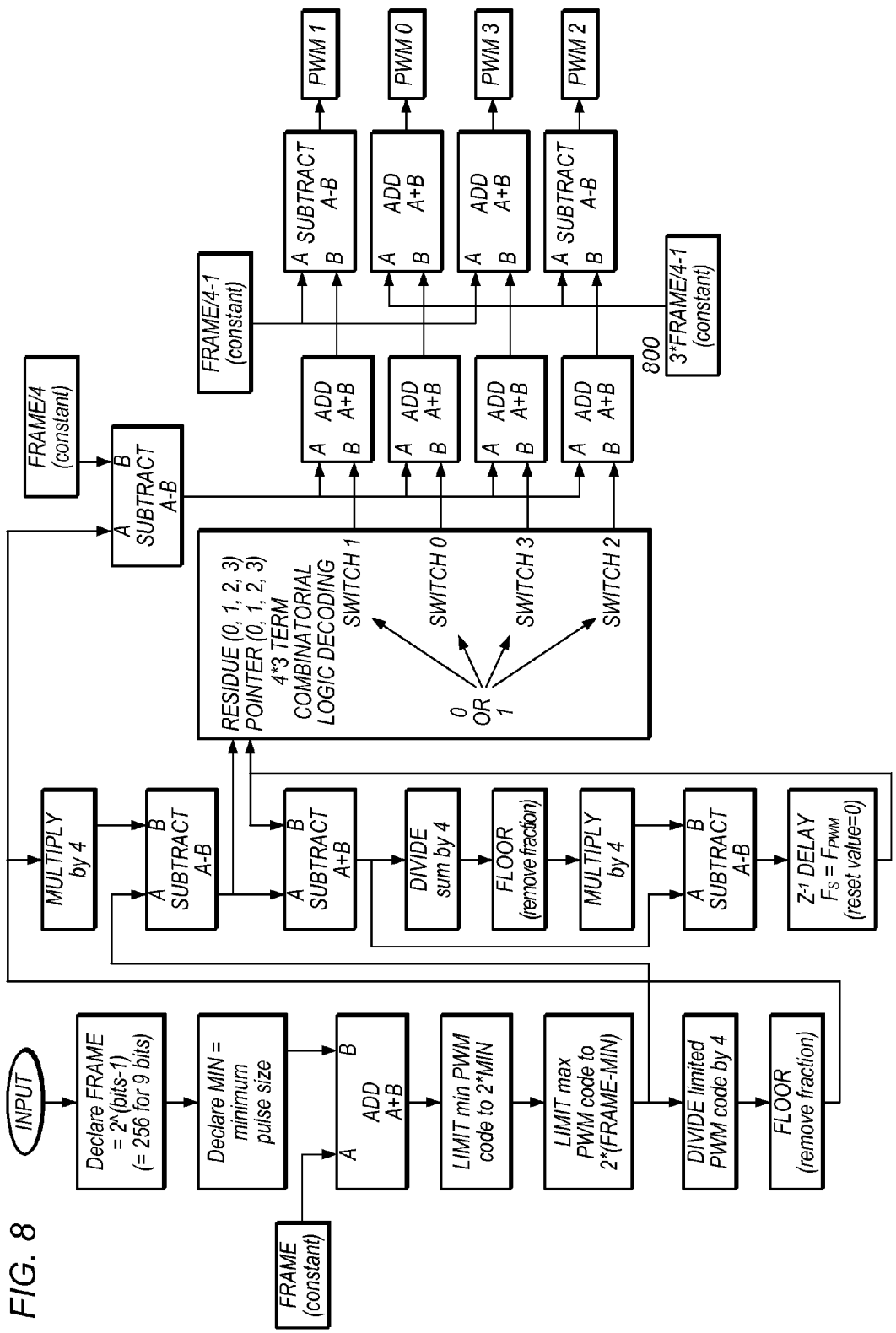
FIG. 8 is a flowchart diagram illustrating operation of the DWA Edge Assignment Calculator of FIG. 7.

FIG. 8 is a flowchart diagram that illustrates the sequence of arithmetic operations shown in FIG. 7. Thus the flowchart diagram of FIG. 8 illustrates the operations described above with respect to FIG. 7, in flowchart form. The flowchart of FIG. 8 is not described in detail, as this operation has been described with respect to FIG. 7.

Figure 9A:
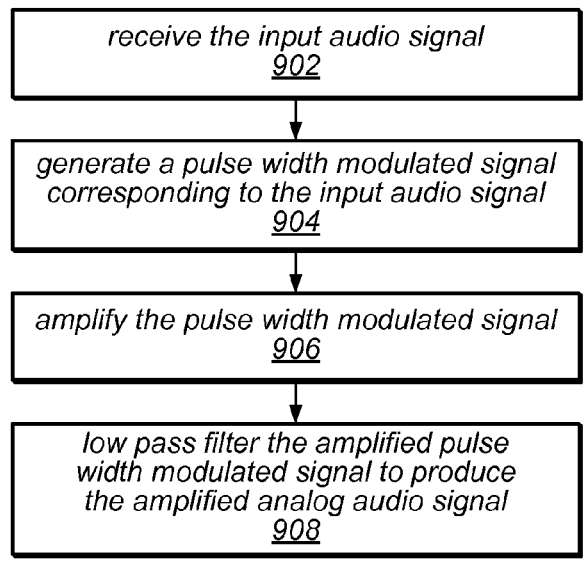
FIG. 9A is a flowchart diagram illustrating operation of the audio amplifier according to one embodiment of the invention.

FIG. 9A is a flowchart diagram illustrating operation of the audio amplifier according to one embodiment of the invention. More particularly, FIG. 9A shows a method for amplifying an input audio signal to produce an amplified audio signal. The method performs a plurality of iterations of the steps shown in FIG. 9A.

As shown, in 902 the input audio signal is received.

In 904 a pulse width modulated signal is generated corresponding to the input audio signal. An integrated area of the pulse width modulated signal corresponds to an instantaneous value of the amplitude of the input audio signal. Generation of the pulse width modulated signal is described in greater detail with respect to FIG. 9B.

In 906 the pulse width modulated signal is amplified.

In 908 low pass filtering is performed on the amplified pulse width modulated signal to produce the amplified analog audio signal.

Figure 9B:
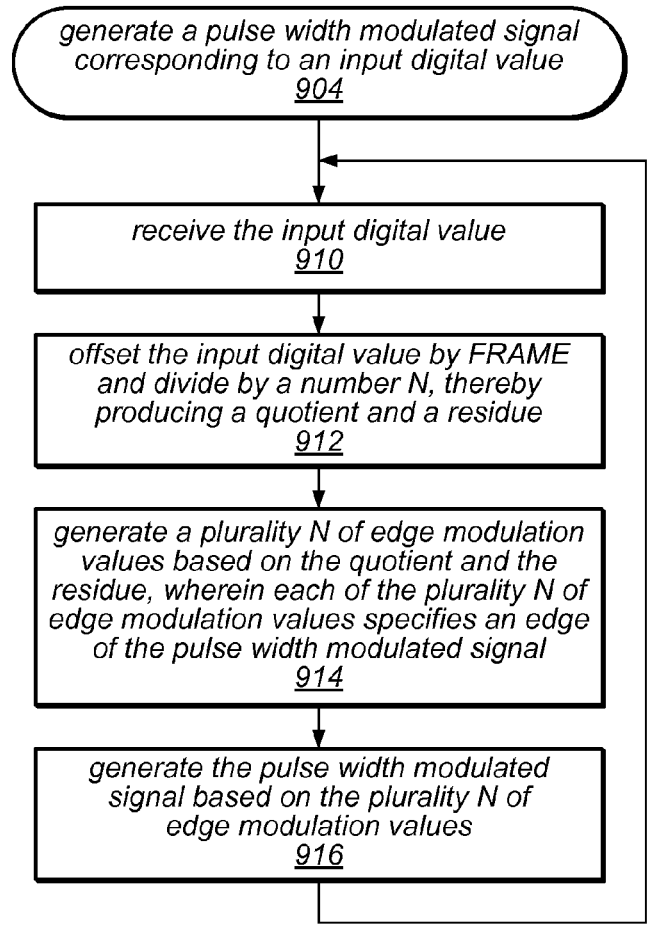
FIG. 9B is a flowchart diagram illustrating generation of a pulse width modulated signal according to one embodiment of the invention.

FIG. 9B is a flowchart diagram illustrating generation of a pulse width modulated signal corresponding to an input digital value according to one embodiment of the invention. The method of FIG. 9B may be performed to implement 904 of FIG. 9A. It is noted that the method of FIG. 9B may be performed in any of various applications, including audio amplifiers, power conversion, power amplifiers used in, e.g., driving transducer arrays, such as the voice coil motors in vibration tables, etc., and other applications where pulse width modulation of signals is employed. Thus, embodiments of the invention may be used in any of various applications where pulse width modulation of signals is employed.

As shown, in 910 the input digital value is received.

In 912 the input digital value may be offset by a fixed constant "FRAME" to produce a positive integer, and then divided by a number N, thereby producing a quotient and a residue. In another embodiment, the input digital value received in 910 may have been previously offset by a constant to produce a positive integer suitable for division.

In 914 a plurality N of edge modulation values are generated based on the quotient and the residue. Each of the plurality N of edge modulation values specifies an edge of the pulse width modulated signal. Generation of the plurality N of edge modulation values may comprise applying the residue to one or more of the plurality N of edge modulation values when the residue is greater than zero. The residue may be applied to different ones of the plurality N of edge modulation values during different iterations of steps 910-916. The pulse width modulated signal may then be generated based on the plurality N of edge modulation values.

In one embodiment, the residue is applied to different ones of the plurality N of edge modulation values during different iterations in a non-stationary assignment fashion. For example, the residue may be applied to different ones of the plurality N of edge modulation values during different iterations in a data weighted averaging fashion. The data weighted averaging may be first order data weighted averaging, or may be second or higher order data weighted averaging.

In one embodiment, application of the residue to one or more of the plurality N of edge modulation values operates to assign pulse width to one or more of the edges of the pulse width modulated signal. For example, unit pulses may be assigned to one or more edges of the pulse width modulated signal. The number of unit pulses assigned during a specific iteration preferably corresponds to the value of the residue in that specific iteration. The unit pulses may be assigned to edges of the pulse width modulated signal in a Modulo-N sequential fashion based on a pre-defined edge ordering. In one embodiment, the method is configured to dynamically change the pre-defined edge ordering during different iterations of the method.

In applying the residue (i.e., applying the unit pulses) to one or more of the plurality N of edge modulation values, for each iteration, the method may comprise: 1) calculating a pointer value that indicates the starting edge location for the assignment of unit pulses to one or more of the plurality N of edge locations, where the number of edge locations being assigned corresponds to the residue value in the current iteration; and 2) incrementing the pointer value by the value of the residue. Calculating the pointer value for a current iteration comprises maintaining a previous pointer value from a prior iteration, and adding a value of the residue in the previous iteration to the previous pointer value. Stated another way, calculating the pointer value for a following iteration may comprise adding a value of the residue in the current iteration to the current pointer value.

In one embodiment, applying the residue to one or more of the plurality N of edge modulation values operates to assign a single unit pulse to each of one or more edges of the pulse width modulated signal in a sequential manner. In this embodiment, the number of unit pulses assigned during a specific iteration corresponds to the value of the residue in that specific iteration. Further assignment of the single unit pulses to each of the one or more edges may comprises using only a subset N of M assignment possibilities, where M>N, such that the assignment of unit pulses is sequential.

In one embodiment, the pulse width modulated signal that is produced is a differential signal comprising N/2 pulse waveforms, each pulse waveform having a leading edge and a trailing edge. The plurality N of edge modulation values may comprises N edge modulation values, wherein the N edge modulation values modulate the respective leading and trailing edges of the N/2 pulse waveforms. For example, where N=4, there are 4 edge modulation values, and the pulse width modulated signal is a differential signal comprising 2 pulse waveforms, each pulse waveform comprising a single leading edge and a single trailing edge.

Steps 910-916 may be repeated a plurality of times. For example, steps 910-916 may be repeated during performance of step 904 in each iteration of steps 902-908.

As described above, the residue may be applied to different ones of the plurality N of edge modulation values during different iterations of steps 910-916 (or different iterations of step 904). This provides a "non-stationary" residue assignment, where the term "non-stationary" refers to the fact that during different iterations the residue is assigned to different edges of the pulse width modulated signal.

Figure 10:
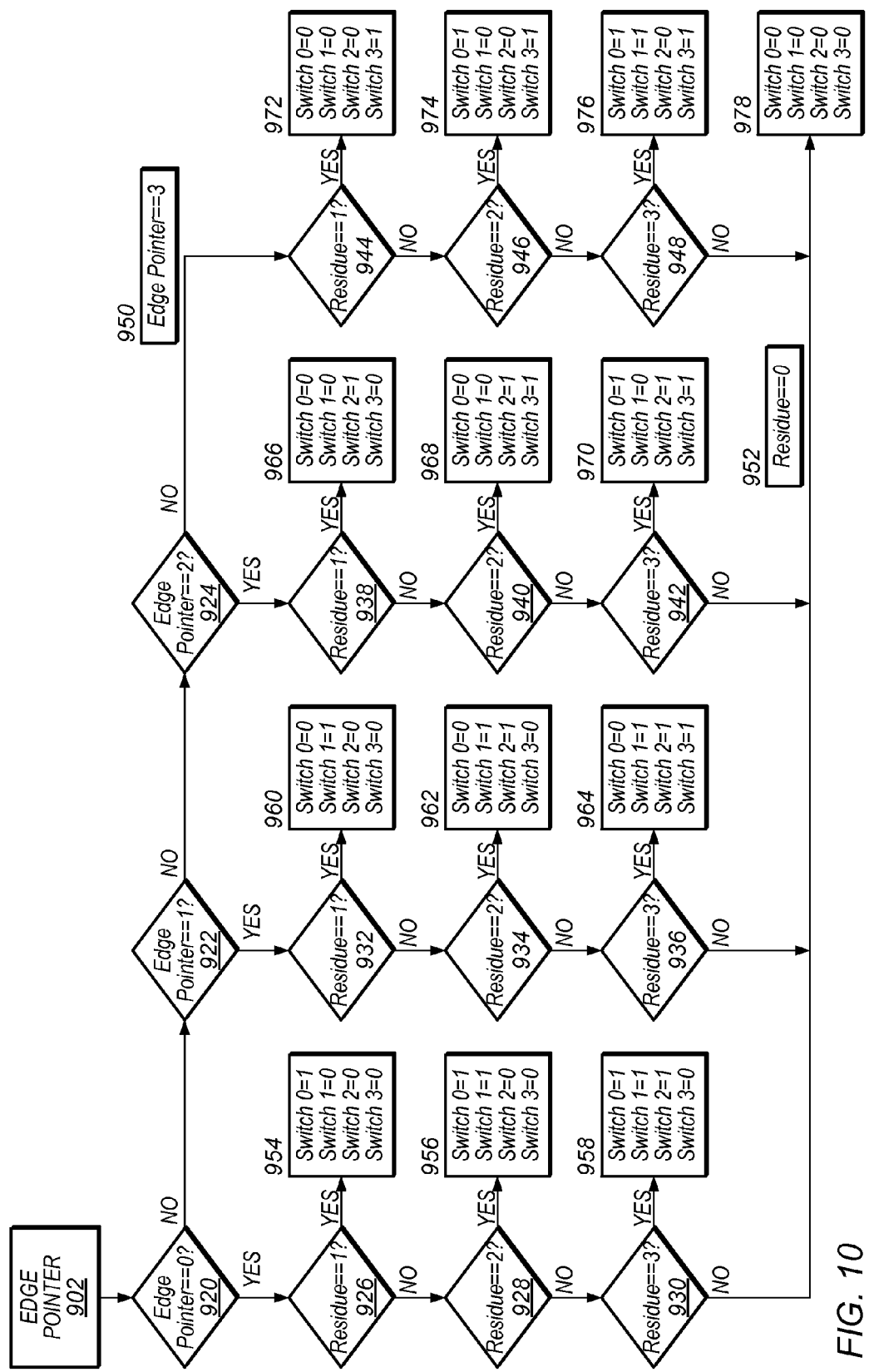
FIG. 10 is a flowchart diagram illustrating the decoding performed by the Combinatorial Logic Decoding block in the DWA Edge Assignment Calculator of FIG. 7.

FIG. 10 is a flowchart diagram illustrating the decoding performed by Combinatorial Logic Decoding (4×3 terms) block 740 in the DWA Edge Assignment Calculator of FIG. 7.

FIG. 11 illustrates the edge assignment ordering performed by the Quad-Edge Digital PWM block 204 of FIG. 4, where CM_INV=0.

FIG. 12 illustrates the edge assignment ordering performed by the Quad-Edge Digital PWM block 204 of FIG. 4, where CM_INV=1.

Figure 13:
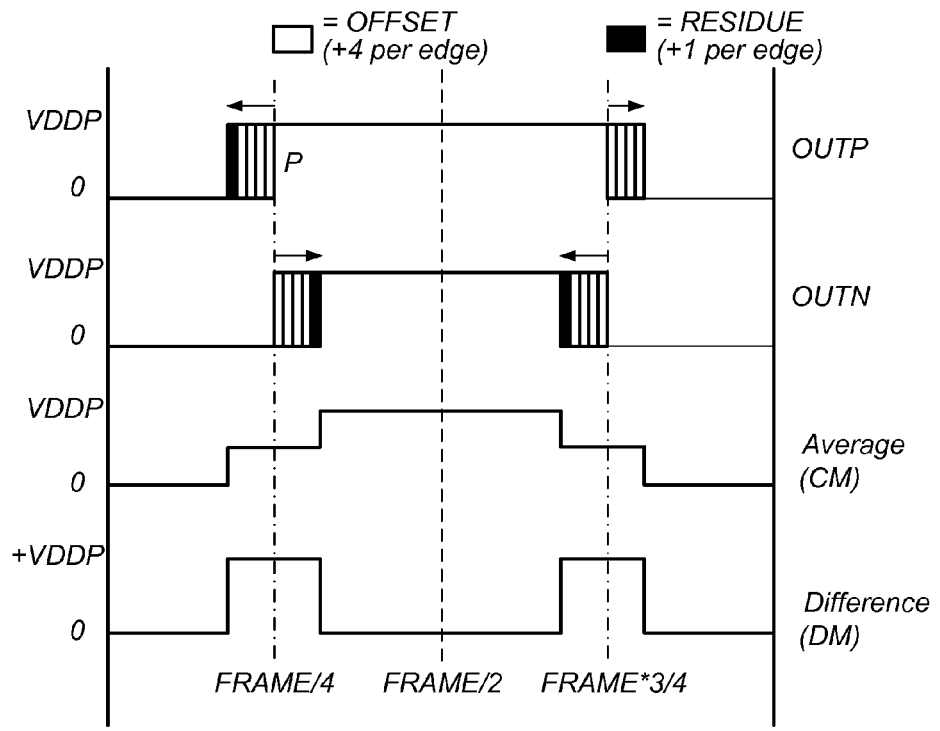
FIG. 13 illustrates a representative edge assignment set for the case where OFFSET is +4, RESIDUE is +3, the pointer value is 1 and CM_INV=0.

FIG. 13 illustrates the DWA edge assignment algorithm behavior for the case where the Digital PWM input code is +19, the OFFSET value is +4, and the RESIDUE value is +3. In this case the current pointer location is set to 1, as indicated by a "P" next to Edge 1 in the diagram. The next pointer value is calculated to be 0.

Figure 14:
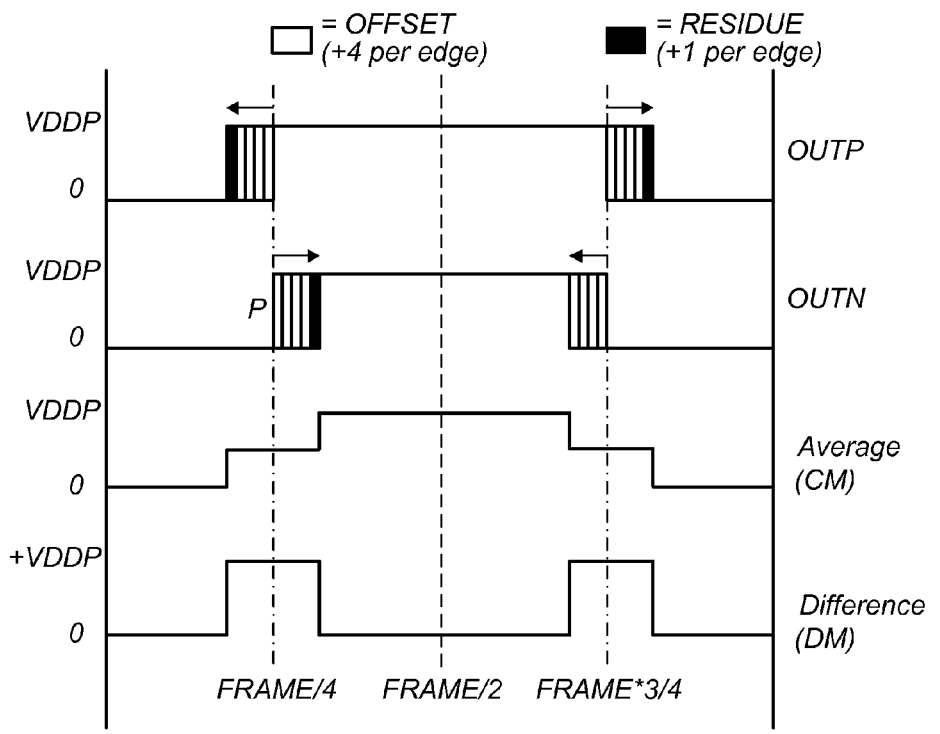
FIG. 14 illustrates a representative edge assignment set for the case where OFFSET is +4, RESIDUE is +3, the pointer value is 3 and CM_INV=0.

FIG. 14 illustrates the DWA edge assignment algorithm behavior for the case where the Digital PWM input code is +19, the OFFSET value is +4, and the RESIDUE value is +3. In this case the current pointer location is set to 3, as indicated by a "P" next to Edge 3 in the diagram. The next pointer value is calculated to be 2.

Figure 15:
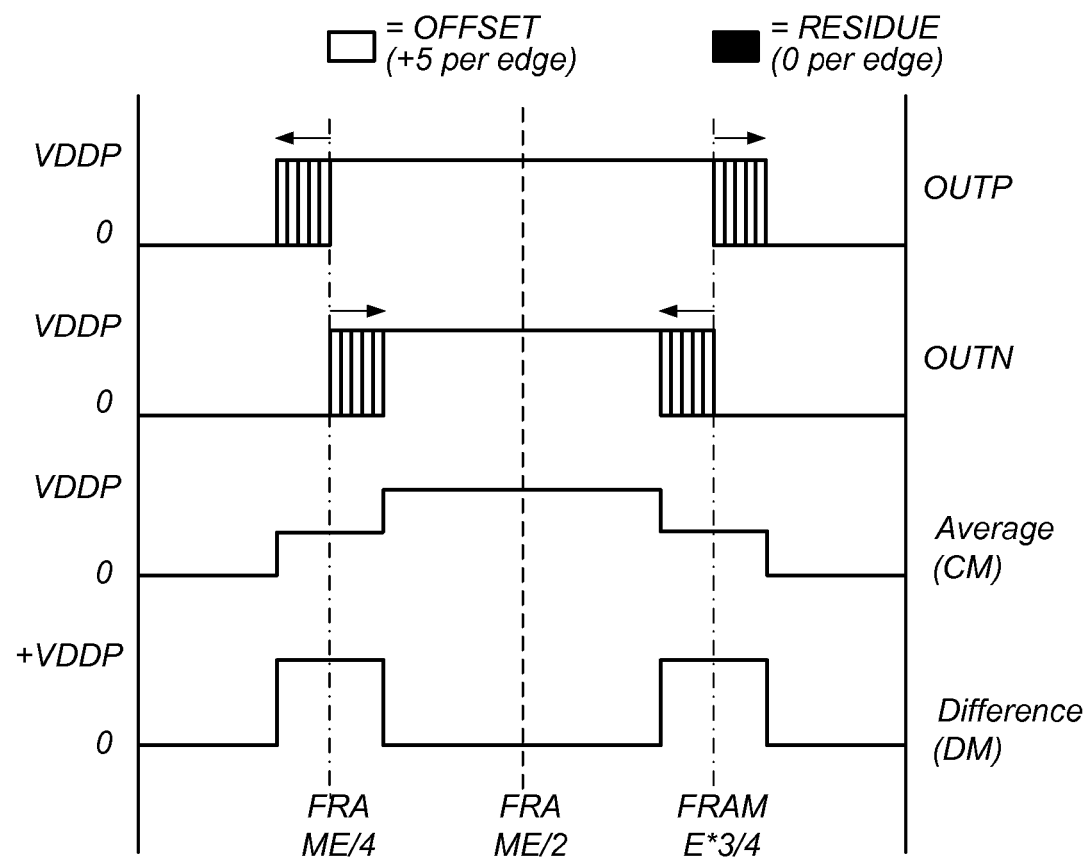
FIG. 15 illustrates a representative edge assignment set for the case where OFFSET is +5, RESIDUE is 0, the pointer value is irrelevant and CM_INV=0.

FIG. 15 illustrates the DWA edge assignment algorithm behavior for the case where the Digital PWM input code is +20, the OFFSET value is 5, and the RESIDUE value is 0. In this case the pointer value is irrelevant, since it does not affect the edge assignment ordering. Also the pointer is not incremented.

Figure 16A:
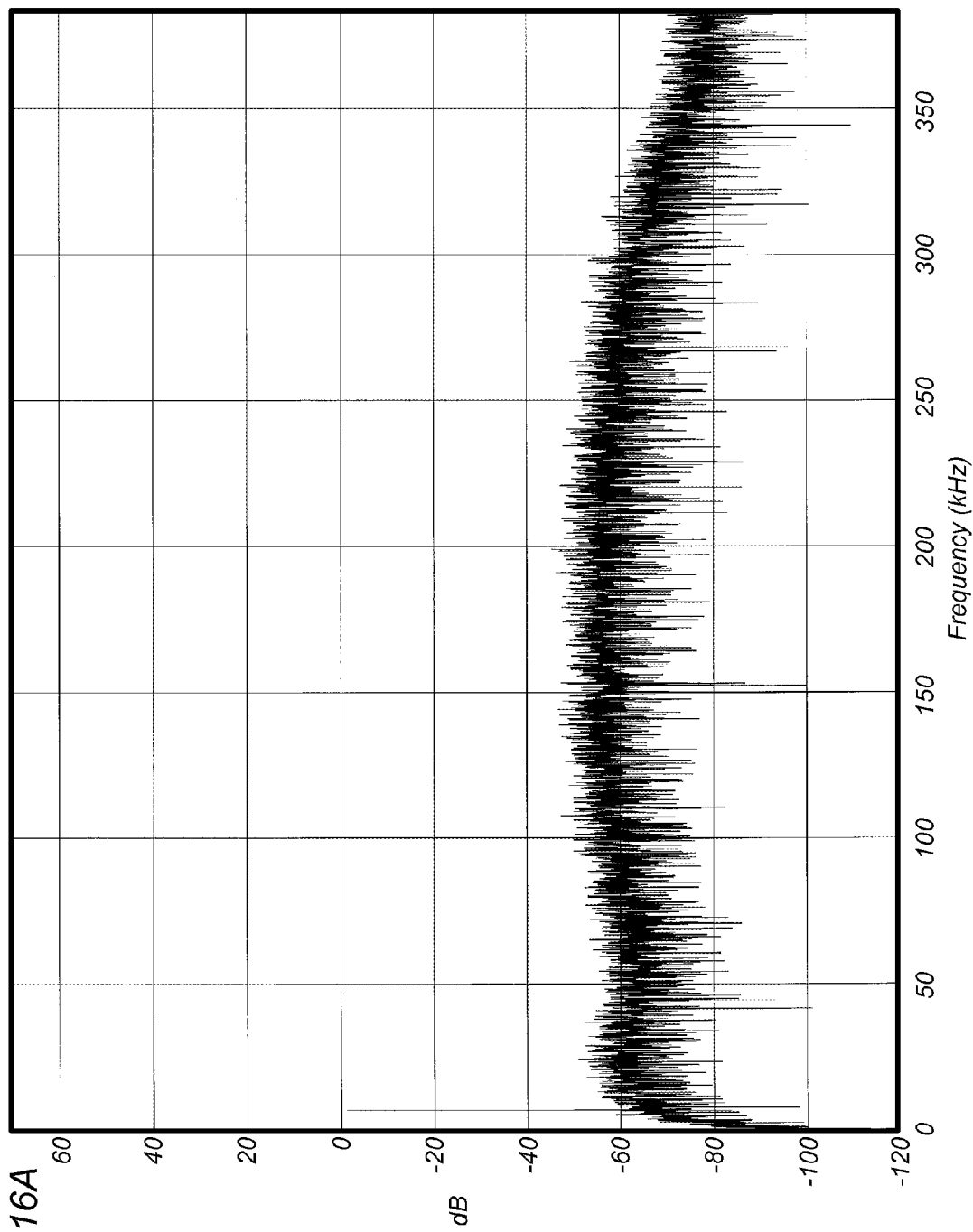
FIG. 16A illustrates an output spectrum of the output differential signal (OUTP−OUTN) with non-stationary residue assignment "turned off"

FIG. 16A illustrates the spectrum of a low pass filtered differential output signal (OUTP−OUTN) with non-stationary residue assignment "turned off" and the pointer location statically forced to Edge 0. The output differential signal is generated from a 24 bit digital sine wave source that produces an input signal of 6.75 kHz at −60 dB relative to full scale, with a pulse repetition frequency of 768 kHz. As shown, the output spectrum exhibits a distinct noise floor peak in the range of 0-50 kHz, which is due to noise intermodulation effects in the Quad Edge DPWM 204.

Figure 16B:
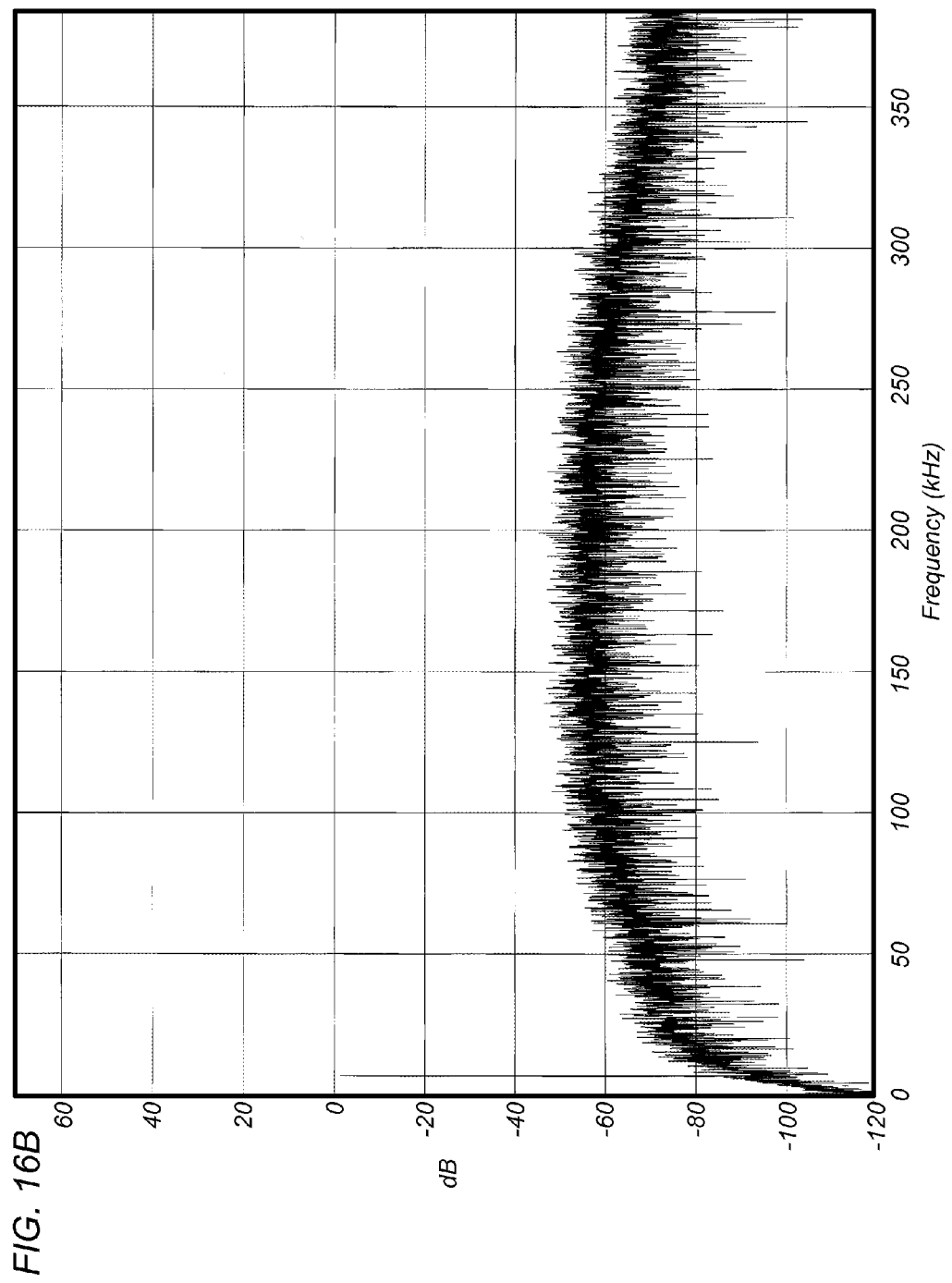
FIG. 16B illustrates an output spectrum of the output differential signal (OUTP−OUTN) with non-stationary residue assignment "turned on" according to one embodiment of the invention as described herein.

FIG. 16B illustrates the spectrum of a low pass filtered differential output signal (OUTP−OUTN) with non-stationary residue assignment "turned on" according to one embodiment of the invention as described herein. In FIG. 16B the pointer location is calculated using non-stationary first order data weighted averaging. The output differential signal is generated from a 24 bit digital sine wave source that produces an input signal of 6.75 kHz at −60 dB relative to full scale, with a pulse repetition frequency of 768 kHz. As shown, the output spectrum exhibits a greatly reduced noise floor peak in the range of 0-50 kHz. Thus, as shown, the non-stationary residue assignment operates to reduce noise intermodulation effects in the Quad Edge DPWM 204 to an acceptable level suitable for, e.g., digital amplification of audio signals.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A method for generating a pulse width modulated signal corresponding to an input digital value, the method comprising:
    performing a plurality of iterations of:
        receiving the input digital value;
        dividing the input digital value by a number N, thereby producing a quotient and a residue;
        generating a plurality N of edge modulation values based on the quotient and the residue, wherein each of the plurality N of edge modulation values specifies an edge of the pulse width modulated signal;
        wherein said generating comprises applying the residue to one or more of the plurality N of edge modulation values when the residue is greater than zero;
        wherein the residue is applied to different ones of the plurality N of edge modulation values during different iterations;
    generating the pulse width modulated signal based on the plurality N of edge modulation values.

2. The method of claim 1,
    wherein the residue is applied to different ones of the plurality N of edge modulation values during different iterations in a non-stationary assignment fashion.

3. The method of claim 1,
    wherein the residue is applied to different ones of the plurality N of edge modulation values during different iterations in a data weighted averaging fashion.

4. The method of claim 1,
    wherein the residue is applied to different ones of the plurality N of edge modulation values during different iterations in a first order data weighted averaging fashion.

5. The method of claim 1,
    wherein the residue is applied to different ones of the plurality N of edge modulation values during different iterations in a second or higher order data weighted averaging fashion.

6. The method of claim 1,
    wherein said applying the residue to one or more of the plurality N of edge modulation values operates to assign pulse width to one or more of the edges of the pulse width modulated signal.

7. The method of claim 1,
    wherein said applying the residue to one or more of the plurality N of edge modulation values operates to assign unit pulses to ones of the edges of the pulse width modulated signal;
    wherein the number of unit pulses assigned during an iteration corresponds to the value of the residue during the iteration.

8. The method of claim 7,
wherein said applying operates to assign the unit pulses to edges of the pulse width modulated signal in a modulo N sequential fashion based on a pre-defined edge ordering.

9. The method of claim 8, further comprising:
dynamically changing the pre-defined edge ordering for different iterations of said applying.

10. The method of claim 1,
wherein said applying the residue to one or more of the plurality N of edge modulation values operates to assign a single unit pulse to each of one or more edges of the pulse width modulated signal;
wherein the number of unit pulses assigned during an iteration corresponds to the value of the residue.

11. The method of claim 1, wherein said applying the residue to one or more of the plurality N of edge modulation values comprises, for each iteration:
calculating a pointer value that indicates a starting edge location for assignment of unit pulses to one or more of the plurality N of edge locations; and
incrementing the pointer value by the value of the residue in a modulo N arithmetic fashion;
wherein the number of edge locations being assigned corresponds to the residue value during an iteration.

12. The method of claim 11, wherein said calculating the pointer value for each iteration comprises:
maintaining a previous pointer value from a previous iteration; and
adding a value of the residue in the previous iteration to the previous pointer value.

13. The method of claim 1,
wherein the pulse width modulated signal is a differential signal comprising N/2 pulse waveforms, each pulse waveform having a leading edge and a trailing edge;
wherein the plurality N of edge modulation values comprises N edge modulation values, wherein the N edge modulation values modulate the respective leading and trailing edges of the N/2 pulse waveforms.

14. The method of claim 1,
wherein said applying the residue to one or more of the plurality N of edge modulation values operates to assign a single unit pulse to each of one or more edges of the pulse width modulated signal in a sequential manner;
wherein the number of unit pulses assigned during an iteration corresponds to the value of the residue;
wherein said assigning the single unit pulses to each of the one or more edges comprises using only a subset N of M assignment possibilities, where M>N, such that the assignment of unit pulses is sequential.

15. The method of claim 1,
receiving a first input digital value; and
offsetting the first input digital value by a specified value to produce the input digital value.

16. A method for amplifying an input audio signal to produce an amplified analog audio signal, the method comprising:
performing a plurality of iterations of:
receiving the input audio signal;
generating a pulse width modulated signal corresponding to the input audio signal, wherein an integrated area of the pulse width modulated signal corresponds to an instantaneous value of the amplitude of the input audio signal, wherein said generating the pulse width modulated signal comprises:
dividing the input digital value by a number N, thereby producing a quotient and a residue;
generating a plurality N of edge modulation values based on the quotient and the residue, wherein each of the plurality N of edge modulation values specifies an edge of the pulse width modulated signal,
wherein said generating comprises applying the residue to one or more of the plurality N of edge modulation values when the residue is greater than zero;
wherein the residue is applied to different ones of the plurality N of edge modulation values during different iterations;
generating the pulse width modulated signal based on the plurality N of edge modulation values;
amplifying the pulse width modulated signal;
low pass filtering the amplified pulse width modulated signal to produce the amplified analog audio signal.

17. The method of claim 16,
wherein the residue is applied to different ones of the plurality N of edge modulation values during different iterations in a non-stationary assignment fashion.

18. The method of claim 16,
wherein the residue is applied to different ones of the plurality N of edge modulation values during different iterations in a data weighted averaging fashion.

19. The method of claim 16,
wherein said applying the residue to one or more of the plurality N of edge modulation values operates to assign pulse width to one or more of the edges of the pulse width modulated signal.

20. The method of claim 16,
wherein said applying the residue to one or more of the plurality N of edge modulation values operates to assign unit pulses to one or more of the edges of the pulse width modulated signal;
wherein the number of unit pulses assigned during an iteration corresponds to the value of the residue.

21. The method of claim 20,
wherein said applying operates to assign the unit pulses to edges of the pulse width modulated signal in a modulo N sequential fashion based on a pre-defined edge ordering.

22. The method of claim 21, further comprising:
dynamically changing the pre-defined edge ordering during said applying.

23. The method of claim 16,
wherein said applying the residue to one or more of the plurality N of edge modulation values operates to assign a single unit pulse to each of one or more edges of the pulse width modulated signal;
wherein the number of unit pulses assigned during an iteration corresponds to the value of the residue.

24. The method of claim 16, wherein said applying the residue to one or more of the plurality N of edge modulation values comprises, for each iteration:
calculating a pointer value that indicates a starting edge location for assignment of unit pulses to one or more of the plurality N of edge locations; and
incrementing the pointer value by the value of the residue in a modulo N arithmetic fashion;
wherein the number of edge locations being assigned corresponds to the residue value during an iteration.

25. The method of claim 24, wherein said calculating the pointer value for the following iteration comprises:
adding a value of the residue in the current iteration to the current pointer value in a modulo N arithmetic fashion;
wherein the current pointer value was calculated to be equal to the modulo N arithmetic sum of the pointer value from the previous iteration and the residue value from the previous iteration.

26. The method of claim 16,
wherein the pulse width modulated signal is a differential signal comprising N/2 pulse waveforms, each pulse waveform having a leading edge and a trailing edge;
wherein the plurality N of edge modulation values comprises N edge modulation values, wherein the N edge modulation values modulate the respective leading and trailing edges of the N/2 pulse waveforms.

27. The method of claim 16,
wherein said applying the residue to one or more of the plurality N of edge modulation values operates to assign a single unit pulse to each of one or more edges of the pulse width modulated signal in a sequential manner;
wherein the number of unit pulses assigned during an iteration corresponds to the value of the residue;
wherein said assigning the single unit pulses to each of the one or more edges comprises using only a subset N of M assignment possibilities, where M>N, such that the assignment of unit pulses is sequential.

28. An audio amplifier, comprising:
an input for receiving an input audio signal;
edge modulation logic configured to:
 divide the input digital value by a number N, thereby producing a quotient and a residue;
 generate a plurality N of edge modulation values based on the quotient and the residue, wherein each of the plurality N of edge modulation values specifies an edge of the pulse width modulated signal,
  wherein said generating comprises applying the residue to one or more of the plurality N of edge modulation values when the residue is greater than zero;
  wherein the residue is applied to different ones of the plurality N of edge modulation values during different iterations;
a plurality of pulse width modulators coupled to the edge modulation logic, wherein each of the plurality of pulse width modulators is configured to generate an edge of a pulse width modulated signal;
amplification logic coupled to the plurality of pulse width modulators and configured to amplify the pulse width modulated signal;
a low pass filter coupled to the amplification logic and configured to low pass filter the amplified pulse width modulated signal to produce an amplified analog audio signal.

29. The audio amplifier of claim 28,
wherein the edge modulation logic is configured to apply the residue to different ones of the plurality N of edge modulation values during different iterations in a non-stationary assignment fashion.

30. The audio amplifier of claim 28,
wherein the edge modulation logic is configured to apply the residue to different ones of the plurality N of edge modulation values during different iterations in a data weighted averaging fashion.

31. The audio amplifier of claim 28,
wherein, in applying the residue to one or more of the plurality N of edge modulation values, the edge modulation logic is configured to assign pulse width to one or more of the edges of the pulse width modulated signal.

32. The audio amplifier of claim 28,
wherein, in applying the residue to one or more of the plurality N of edge modulation values, the edge modulation logic is configured to assign unit pulses to one or more of the edges of the pulse width modulated signal;
wherein the number of unit pulses assigned during an iteration corresponds to the value of the residue.

33. The audio amplifier of claim 32,
wherein, in applying the residue to one or more of the plurality N of edge modulation values, the edge modulation logic is configured to assign the unit pulses to edges of the pulse width modulated signal in a modulo N sequential fashion based on a pre-defined edge ordering.

34. The audio amplifier of claim 33,
wherein the edge modulation logic is configured to dynamically change the pre-defined edge ordering during said applying the residue.

35. The audio amplifier of claim 28, wherein, in applying the residue to one or more of the plurality N of edge modulation values, for each iteration the edge modulation logic is configured to:
calculate a pointer value that indicates a starting edge location for assignment of unit pulses to one or more of the plurality N of edge locations; and
increment the pointer value by the value of the residue in a modulo N arithmetic fashion;
wherein the number of edge locations being assigned corresponds to the residue value during an iteration.

36. The audio amplifier of claim 28,
wherein, in applying the residue to one or more of the plurality N of edge modulation values, the edge modulation logic is configured to assign a single unit pulse to each of one or more edges of the pulse width modulated signal;
wherein the number of unit pulses assigned during an iteration corresponds to the value of the residue.

37. The audio amplifier of claim 28,
wherein the pulse width modulated signal is a differential signal comprising N/2 pulse waveforms, each pulse waveform having a leading edge and a trailing edge;
wherein the plurality N of edge modulation values comprises N edge modulation values, wherein the N edge modulation values modulate the respective leading and trailing edges of the N/2 pulse waveforms.

38. The audio amplifier of claim 28,
wherein, in applying the residue to one or more of the plurality N of edge modulation values, the edge modulation logic is configured to assign a single unit pulse to each of one or more edges of the pulse width modulated signal in a sequential manner;
wherein the number of unit pulses assigned during an iteration corresponds to the value of the residue;
wherein assignment of the single unit pulses to each of the one or more edges comprises using only a subset N of M assignment possibilities, where M>N, such that the assignment of unit pulses is sequential.

39. The audio amplifier of claim 28,
wherein the edge modulation logic is further configured to offset the input digital value by a specified value prior to dividing the input digital value by the number N.

* * * * *